(12) United States Patent
Yoshikawa

(10) Patent No.: US 9,184,268 B2
(45) Date of Patent: Nov. 10, 2015

(54) SEMICONDUCTOR DEVICE

(71) Applicant: FUJI ELECTRIC CO., LTD., Kawasaki-shi (JP)

(72) Inventor: Koh Yoshikawa, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/450,836

(22) Filed: Aug. 4, 2014

(65) Prior Publication Data

US 2014/0339600 A1 Nov. 20, 2014

Related U.S. Application Data

(63) Continuation of application No. PCT/JP2013/053438, filed on Feb. 13, 2013.

(30) Foreign Application Priority Data

Mar. 16, 2012 (JP) ................. 2012-060384

(51) Int. Cl.
*H01L 31/113* (2006.01)
*H01L 29/00* (2006.01)
(Continued)

(52) U.S. Cl.
CPC ........ *H01L 29/7397* (2013.01); *H01L 29/0834* (2013.01); *H01L 29/1095* (2013.01);
(Continued)

(58) Field of Classification Search
CPC ............ H01L 29/7397; H01L 29/7813; H01L 29/1095; H01L 2924/1305; H01L 2924/13055; H01L 29/66734; H01L 29/7393

USPC ........ 257/330, 341, 401, 544, 552, 559, 560, 257/563–566, 591, 592; 438/202, 206, 268, 438/270, 272, 309, 338, 342, 343
See application file for complete search history.

(56) References Cited

U.S. PATENT DOCUMENTS 7,977,704 B2 * 7/2011 Koyama et al. ............... 257/139
2002/0048915 A1 4/2002 Reznik
(Continued)

FOREIGN PATENT DOCUMENTS

JP 09-260662 A 10/1997
JP 09-326486 A 12/1997
(Continued)

OTHER PUBLICATIONS

International Search Report issued in PCT/JP2013/053438, Mailing date May 28, 2013.

*Primary Examiner* — Hsien Ming Lee
(74) *Attorney, Agent, or Firm* — Rossi, Kimms & McDowell LLP

(57) ABSTRACT

A trench gate MOS structure is provided on one main surface of a semiconductor substrate which will be an n⁻ drift region. An n shell region is provided in the n⁻ drift region so that it contacts a surface of a p base region close to the n⁻ drift region forming the trench gate MOS structure. The n shell region has a higher impurity concentration than the n⁻ drift region. The effective dose of n-type impurities in the n shell region is equal to or less than $5.0 \times 10^{12}$ cm$^{-2}$. The n⁻ drift region has a resistivity to prevent a depletion layer, which is spread from a p collector region on the other main surface when reverse rated voltage is applied with an emitter as positive electrode, from reaching either n shell region or the bottom of a first trench, whichever is closer to the p collector region.

8 Claims, 15 Drawing Sheets

(51) Int. Cl.
*H01L 27/082* (2006.01)
*H01L 21/8238* (2006.01)
*H01L 21/336* (2006.01)
*H01L 21/331* (2006.01)
*H01L 29/739* (2006.01)
*H01L 29/36* (2006.01)
*H01L 29/66* (2006.01)
*H01L 29/08* (2006.01)
*H01L 29/10* (2006.01)
*H01L 29/40* (2006.01)
*H01L 29/06* (2006.01)

(52) U.S. Cl.
CPC .......... *H01L29/36* (2013.01); *H01L 29/66348* (2013.01); *H01L 29/7395* (2013.01); *H01L 29/0619* (2013.01); *H01L 29/404* (2013.01)

(56) References Cited

U.S. PATENT DOCUMENTS

2008/0265276 A1    10/2008   Noda et al.
2011/0156210 A1     6/2011   Yoshikawa

FOREIGN PATENT DOCUMENTS

| JP | 2001-320049 A | 11/2001 |
| JP | 2002-246597 A | 8/2002 |
| JP | 2002-319676 A | 10/2002 |
| JP | 2002-532885 A | 10/2002 |
| JP | 2003-318399 A | 11/2003 |
| JP | 2006-080269 A | 3/2006 |
| JP | 2008-277352 A | 11/2008 |
| JP | 2010-219361 A | 9/2010 |
| JP | 2011-155257 A | 8/2011 |

\* cited by examiner

SEMICONDUCTOR DEVICE

BACKGROUND OF THE INVENTION

A. Field of the Invention

The present invention relates to semiconductor devices including a reverse blocking semiconductor device and a bidirectional semiconductor device, and more particularly, to trench gate semiconductor devices.

B. Description of the Related Art

In recent years, in a power conversion circuit which performs, for example, AC (alternating current)/AC conversion, AC/DC (direct current) conversion, or DC/AC conversion using a semiconductor element, a matrix converter has been known as a direct conversion circuit which can be configured without using a DC smoothing circuit including, for example, an electrolytic capacitor or a DC reactor. Since the matrix converter is used at an AC voltage, a plurality of switching devices forming the matrix converter need to be bidirectional switching devices with bidirectionality which can control a current in the forward direction and the reverse direction. As this type of bidirectional switching device, a bidirectional switching device has been used which is formed by connecting two devices, each of which includes a diode for a reverse breakdown voltage that is connected in series to a general insulated gate bipolar transistor (hereinafter, referred to as an IGBT) in inverse and can control a current in two directions.

In recent years, a reverse blocking IGBT (RB-IGBT) has been used as the above-mentioned bidirectional switching device in order to reduce the size and weight of a circuit, to increase the efficiency and response of the circuit, and to reduce manufacturing costs. The reason is that, when two reverse blocking IGBTs are connected inversely in parallel, it is possible to form the bidirectional switching device, without using the diode for a reverse breakdown voltage. A bidirectional IGBT has the bidirectional switching device, which is formed by connecting two reverse blocking IGBTs in inverse parallel, as a power chip. Next, the structure of the reverse blocking IGBT according to the related art will be described.

FIG. 15 is a cross-sectional view schematically illustrating the structure of the reverse blocking IGBT according to the related art. In the reverse blocking IGBT, in general, an active region 110 is provided at the center and a separation portion 130 is provided in the outer circumference of the active region 110 through an edge termination structure region 120. The separation portion 130 includes a p-type isolation region 31. The active region 110 is the path of a main current of a vertical IGBT including, for example, an n⁻ drift region 1, a p base region 2, an n⁺ emitter region 3, an emitter electrode 9, a p collector region 10, and a collector electrode 11. The isolation region 31 is a p-type region which is formed so as to extend from the front surface of a semiconductor substrate to the p collector region 10 provided on the rear surface side. The structure of the active region 110 will be described in detail with reference to FIG. 16.

FIG. 16 is a cross-sectional view illustrating the detailed structure of the active region in the reverse blocking IGBT according to the related art illustrated in FIG. 15. The n⁻ drift region 1 is a silicon substrate produced by a floating zone (FZ) method (hereinafter, referred to as an FZ silicon substrate). In the IGBT using the FZ silicon substrate, a high-concentration semiconductor substrate is not used, unlike in an IGBT using an epitaxial silicon substrate according to the related art. Therefore, for example, the thickness of the silicon substrate can be reduced to about 100 μm when the rated voltage of the IGBT is 600 V and can be reduced to about 180 μm when the rated voltage of the IGBT is 1200 V.

The p base region 2 is selectively provided in a surface layer of the front surface of the FZ silicon substrate which will be the n⁻ drift region 1. The n⁺ emitter region 3 and the p body region 4 are selectively provided in a surface layer of the p base region 2 which is close to the front surface of the substrate. A gate electrode 7 which is made of polysilicon is provided on the surface of a portion of the p base region 2 which is interposed between the n⁺ emitter region 3 and the n⁻ drift region 1, with a gate insulating film 6 interposed therebetween. The emitter electrode 9 comes into ohmic contact with both the surface of the n⁺ emitter region 3 and the surface of the p⁺ body region 4. The interlayer insulating film 8 is provided between the gate electrode 7 and the emitter electrode 9 and electrically insulates the gate electrode 7 from the emitter electrode 9.

The p collector region 10 and the collector electrode 11 which comes into ohmic contact with the p collector region 10 are provided on the rear surface side of the FZ silicon substrate which will be the n⁻ drift region 1. When the rear surface structure of the FZ silicon substrate is formed in this way, the thickness of the p collector region 10 is reduced and the p collector region 10 is controlled to the required low impurity concentration. Therefore, it is possible to reduce the injection efficiency of a minority carrier from the p collector region 10 and to improve transport efficiency. As a result, in the reverse blocking IGBT having the above-mentioned structure, the trade-off relationship between on-voltage characteristics and turn-off loss is improved and it is possible to reduce both the on-voltage and the turn-off loss.

As this type of reverse blocking IGBT, a reverse blocking IGBT has been proposed in which a p base region is formed in the front surface of a semiconductor substrate, an n⁺ emitter region is formed in the p base region, a p⁺ isolation region and a p⁺ collector region are respectively formed in an outer circumferential portion (the side surface of the substrate) and the rear surface of the semiconductor substrate so as to surround the p base region, and the thickness of the p⁺ collector region in the rear surface is about 1 μm (for example, see JP 2002-319676 A).

In addition, as another reverse blocking IGBT, a high-breakdown-voltage semiconductor device has been proposed in which a single-layered semiconductor substrate has at least pn junctions for forward and reverse breakdown voltages formed on both sides thereof and the breakdown voltage junction termination structure of the two pn junctions is provided on the first main surface of the semiconductor substrate by a separating diffusion region. The single-layered semiconductor substrate includes a region in which an impurity concentration distribution is substantially constant from the first main surface toward the inside or impurity concentration is reduced from the first main surface toward the inside. Therefore, in the reverse blocking IGBT, it is possible to reduce a reverse leakage current, without reducing a reverse breakdown voltage (for example, see JP 2006-080269 A).

As a reverse blocking IGBT with improved electrical characteristics, the following device has been known. FIG. 17 is a diagram illustrating the electric field intensity distributions of the reverse blocking IGBT according to the related art when a forward voltage is applied and when a reverse voltage is applied. FIG. 17A illustrates the cross-sectional structure of a main portion of the reverse blocking IGBT according to the related art. In FIG. 17B, the y-axis indicates the thickness of the reverse blocking IGBT illustrated in FIG. 17A and the x-axis indicates the electric field intensity distributions when the forward voltage is applied and when the reverse voltage is applied. The distance of the y-axis means the distance to an emitter direction when the rear surface of the substrate (the interface between a p collector region 10 and a collector electrode 11) is 0 (zero). In the reverse blocking IGBT illustrated in FIG. 17A, buffer layers 201 and 202 which have the same conductivity type and high impurity concentration are provided at the interface between an n⁻ drift region 1 and a p base region 2 and the interface between the n⁻ drift region 1 and the p collector region 10, respectively. Therefore, it is possible to achieve an IGBT having a forward breakdown voltage value and a reverse breakdown voltage value which are equal to each other (for example, see JP 2002-532885 W).

As an IGBT with improved electrical characteristics, a device has been proposed in which a high-impurity-concentration region that has the same conductivity type as an n⁻ drift region is provided at least a portion of the boundary between a p base region and the n⁻ drift region. According to this structure a channel length is reduced and a voltage drop in an on state is reduced (for example, see JP 09-326486 A).

As another IGBT with improved electrical characteristics, the following device has been proposed. A short lifetime region is provided in a portion of an n drift region close to a p collector region. The short lifetime region is an n-type region and has a higher impurity concentration than an n base layer. According to this structure, it is possible to reduce the leakage current of a non-punch-through (NPT) IGBT (for example, see 09-260662 A).

As another IGBT with improved electrical characteristics, a device has been proposed which includes a second-conductivity-type collector region and a first-conductivity-type field stop region that is formed in a first-conductivity-type semiconductor substrate, has a higher impurity concentration than the first-conductivity-type semiconductor substrate, and is separated from the second-conductivity-type collector region (for example, see JP 2002-246597 A). In JP 2002-246597 A, even when a partial deficiency occurs in the collector region, an increase in the voltage drop characteristics in an on state or the deterioration of the breakdown voltage characteristics is suppressed.

As a bidirectional IGBT with improved electrical characteristics, the following device has been proposed. Gate electrodes are provided in trenches which are formed in two main surfaces of a semiconductor substrate through gate oxide films and trench MOS gate (an metal-oxide-semiconductor insulated gate) structures (hereinafter, referred to as trench gate MOS structures) are formed on the two main surfaces of the semiconductor substrate. A buffer layer which has the same conductivity type as a drift region and has a higher concentration than the drift layer is provided at the interface between the drift region and a base layer on the two main surface sides of the semiconductor substrate. In addition, a depletion layer which is spread to the drift region when an off-voltage is applied extends sufficiently to reach the high-concentration buffer layer. This structure is a punch-through structure. According to this structure, it is possible to improve the breakdown voltages in two directions to the same level and to remove an oscillation waveform when the device is turned off. In addition, it is possible to control the gate in two directions (for example, see JP 2001-320049 A).

As a reverse blocking IGBT with improved electrical characteristics, a device has been proposed in which a second trench groove is formed on the collector electrode side, an oxide film is coated on the surface of the second trench groove, the second trench groove is filled with polysilicon, a second n buffer region is formed in a portion interposed between the second trench grooves, and a depletion layer is spread to an n⁻ drift region over the second n buffer region when a reverse bias is applied, thereby obtaining the reverse breakdown voltage equal to the forward breakdown voltage using a PT structure (for example, see JP 2003-318399 A).

However, in the reverse blocking IGBT disclosed in JP 2002-319676 A, the reverse breakdown voltage is likely to be lower than the forward breakdown voltage. Hereinafter the reason will be described. The planar reverse blocking IGBT requires the p⁺ isolation region which extends from the front surface of the semiconductor substrate to the p⁺ collector region on the rear surface side in order to ensure the reverse blocking capability. A drive diffusion (heat treatment) which is required to form the p⁺ isolation region is performed in an oxygen atmosphere at a high temperature for a long time in order to prevent the surface roughness of the n type silicon substrate. For example, the diffusion time of the heat treatment is about 100 hours at a temperature of 1300° C. in a device for a breakdown voltage of 600 V and is about 200 hours at a temperature of 1300° C. in a device for a breakdown voltage of 1200 V.

When the heat treatment is performed for the silicon substrate in the oxygen atmosphere at a high temperature for a long time, the doped oxygen atom is changed to a donor. In particular, when the silicon substrate has low impurity concentration, the oxygen concentration of the silicon substrate is increased by the influence of the change of the oxygen atom into the donor. Since oxygen concentration in the vicinity of the surface of the silicon substrate is reduced by outward diffusion, the impurity concentration distribution of the silicon substrate is low in the width (depth) range of a few micrometers to tens of micrometers from two main surfaces of the substrate in the depth direction and is high at the center of the substrate. The manufacturing processes of the reverse blocking IGBT include a process of forming a predetermined MOS gate structure and an aluminum electrode film on the front surface, a rear surface grinding process of reducing the thickness of the n drift region to a value required for a breakdown voltage while reducing the on-voltage, and a process of forming the p⁺ collector region and the collector electrode. The amount of grinding of the rear surface of the silicon substrate in the rear surface grinding process is very large, that is, equal to or more than half the original thickness of the silicon substrate. Therefore, as described above, the silicon substrate which is affected by the change of the oxygen atom into the donor has an impurity concentration distribution in which, after the rear surface grinding process, the impurity concentration is high on the collector side for which the rear surface grinding is performed and is obliquely reduced on the emitter side by the influence of outward diffusion in the width (depth range) of a few micrometers to tens of micrometers from the front surface of the substrate in the depth direction.

As a result, since the impurity concentration of a collector-side portion of the n drift region is higher than the impurity concentration of an emitter-side portion of the n drift region, the depletion layer which is spread from the collector junction (the pn junction between the p⁺ collector region and the n drift region) is less likely to be extended than the depletion layer which is spread from the p base junction (the pn junction between the p base region and the n drift region) on the emitter side of the reverse blocking IGBT. Therefore, since the electric field is likely to be increased by the application of a low voltage, the reverse breakdown voltage is lower than the forward breakdown voltage. The influence of the oxygen donor on the breakdown voltage is likely to cause problems when the resistivity of the silicon substrate is large, for example, when the breakdown voltage is equal to or higher than 600 V. For the curvature radius of the circumference of the original pn junction, the breakdown voltage obtained in the collector junction (reverse breakdown voltage junction) is likely to be higher than that in the p base junction (forward breakdown voltage junction). In the device with a breakdown voltage lower than 600 V, the reverse breakdown voltage is likely to be higher than the forward breakdown voltage even when the influence of the oxygen donor on the reverse breakdown voltage is considered.

The technique disclosed in JP 2002-532885 W or JP 09-326486 A has the following problems. For example, as represented by a dashed line in FIG. 17B, if the depletion layer which is spread from the collector junction 21 when the reverse voltage is applied (reverse bias) reaches an emitter-side buffer layer 201 (hereinafter, referred to as a shell region), it is less likely to be extended and the electric field increases rapidly. As a result, an electric field peak (critical electric field intensity) 212 appears in the vicinity of the collector junction 21. In contrast, as represented by a solid line in FIG. 17B, if the depletion layer that is spread from the p base junction 20 when the forward voltage is applied (forward bias) reaches the p collector region 10, similarly, the electric field increases rapidly and an electric field peak 211 appears in the vicinity of the interface of the p base junction 20. Therefore, both the forward breakdown voltage and the reverse breakdown voltage are likely to be reduced. That is, when the shell region 201 and the buffer region (collector-side buffer layer) 202 are provided, it is difficult to achieve the forward breakdown voltage and the reverse breakdown voltage which are obtained when these regions are not provided. As a method for solving the problem of the breakdown voltage being reduced, a method has been known which reduces the impurity concentration of the n⁻ drift region 1 to increase the design breakdown voltage.

However, when the impurity concentration of the n⁻ drift region 1 is reduced, the depletion layer is likely to be spread, but the punch-through phenomenon that the depletion layer reaches the buffer region 202 while the semiconductor device is operating is likely to occur. As a result, a new problem that the voltage waveform and the current waveform in a turn-off state (hereinafter, referred to as a turn-off waveform) oscillate arises. In addition, the reverse blocking IGBT has the characteristic that a large amount of current flows transiently during reverse recovery for which the reverse blocking IGBT is changed from an on state to a reverse blocking state (reverse recovery characteristic). Therefore, the problem that the voltage waveform and the current waveform during reverse recovery (hereinafter, referred to as a reverse recovery waveform) oscillate also arises. When the turn-off waveform and the reverse recovery waveform oscillate, there is a concern that noise will be generated. When the oscillation of the voltage waveform is very large, there is a concern that the semiconductor device will be damaged.

The invention has been made in order to solve the above-mentioned problems of the related art and an object of the invention is to provide a semiconductor device which can improve a reverse breakdown voltage and a forward breakdown voltage, suppress the oscillation of a voltage waveform and a current waveform when the semiconductor device is turned off, and suppress the oscillation of the voltage waveform and the current waveform during reverse recovery.

The present invention is directed to overcoming or at least reducing the effects of one or more of the problems set forth above.

SUMMARY OF THE INVENTION

A semiconductor device according to an aspect of the invention has the following characteristics. A base region of a second conductivity type is selectively provided in a surface layer of one main surface of a semiconductor substrate of a first conductivity type which will be a drift region. An emitter region of the first conductivity type is selectively provided in the base region. A trench that extends from the one main surface of the semiconductor substrate to the drift region through the emitter region and the base region is provided. An insulating film is provided along an inner wall of the trench. A gate electrode is provided in the trench through the insulating film. An emitter electrode comes into contact with the emitter region and the base region. A shell region of the first conductivity type is provided in the drift region so as to come into contact with a surface of the base region close to the drift region. A collector region of the second conductivity type is provided in a surface layer of the other main surface of the semiconductor substrate. The shell region has a higher impurity concentration than the drift region. An effective dose of a first-conductivity-type impurity in the shell region is equal to or less than $5.0 \times 10^{12}$ cm$^2$. The drift region has sufficient resistivity to prevent a depletion layer, which is spread from the collector region when a reverse rated voltage is applied using the emitter electrode as a positive electrode, from reaching one of the shell region and the bottom of the trench which is closer to the collector region than the other.

In the semiconductor device according to the above-mentioned aspect of the invention, the effective dose of the first-conductivity-type impurity in the shell region may be equal to or less than $4.0 \times 10^{12}$ cm$^{-2}$.

In the semiconductor device according to the above-mentioned aspect of the invention, a first-conductivity-type region that has a higher impurity concentration than the drift region to reduce a leakage current may be provided between the drift region and the collector region.

The semiconductor device according to the above-mentioned aspect of the invention may further include an isolation region of the second conductivity type that is provided in an outer circumferential end portion of the drift region and extends from the one main surface of the semiconductor substrate to the collector region.

In the semiconductor device according to the above-mentioned aspect of the invention, the drift region may have sufficient resistivity to prevent the depletion layer, which is spread from the collector region to the base region when the reverse rated voltage is applied using the emitter electrode as the positive electrode, from reaching one of the base region and the bottom of the trench which is closer to the collector region than the other.

A semiconductor device according to another aspect of the invention has the following characteristics. A first base region of a second conductivity type is selectively provided in a surface layer of one main surface of a semiconductor substrate of a first conductivity type which will be a drift region. A first emitter region of the first conductivity type is selectively provided in the first base region. A first trench extends from the one main surface of the semiconductor substrate to the drift region through the first emitter region and the first base region. A first insulating film is provided along an inner wall of the first trench. A first gate electrode is provided in the first trench through the first insulating film. An emitter electrode comes into contact with the first emitter region and the first base region. A first shell region of the first conductivity type is provided in the drift region so as to come into contact with a surface of the first base region close to the drift region. A second base region of the second conductivity type is selectively provided in a surface layer of the other main surface of the semiconductor substrate. A second emitter region of the first conductivity type is selectively provided in the second base region. A second trench extends from the other main surface of the semiconductor substrate to the drift region through the second emitter region and the second base region. A second insulating film is provided along an inner wall of the second trench. A second gate electrode is provided in the second trench through the second insulating film. A rear surface electrode comes into contact with the second emitter region and the second base region. A second shell region of the first conductivity type is provided in the drift region so as to come into contact with a surface of the second base region close to the drift region. The first shell region and the second shell region have a higher impurity concentration than the drift region. An effective dose of a first-conductivity-type impurity in the first shell region and the second shell region is equal to or less than $5.0 \times 10^{12}$ cm$^{-2}$. The drift region has sufficient resistivity to prevent a depletion layer, which is spread from the second base region when a reverse rated voltage is applied using the emitter electrode as a positive electrode, from reaching one of the first shell region and the bottom of the first trench which is closer to the second shell region than the other.

In the semiconductor device according to the above-mentioned aspect of the invention, the effective dose of the first-conductivity-type impurity in the second shell region may be equal to or less than $4.0 \times 10^{12}$ cm$^{-2}$.

In the semiconductor device according to the above-mentioned aspect of the invention, the drift region may have sufficient resistivity to prevent the depletion layer, which is spread from the second base region to the first base region when the reverse rated voltage is applied using the emitter electrode as the positive electrode, from reaching one of the first base region and the bottom of the first trench which is closer to the second shell region than the other.

According to the above-mentioned aspect of the invention, since the shell region is provided in the drift region so as to come into contact with the base region, it is possible to reduce the electric field in the semiconductor substrate, as compared to the related art. Therefore, it is possible to improve the forward breakdown voltage and the reverse breakdown voltage. In addition, according to the above-mentioned aspect of the invention, since the effective dose of the first-conductivity-type impurity in the shell region is equal to or less than $5.0 \times 10^{12}$ cm$^{-2}$, it is possible to shorten the period until the reverse recovery current of the reverse recovery waveform converges from a negative value to zero, as compared to the related art. That is, it is possible to recover the blocking voltage faster than the related art.

A semiconductor device according to another aspect of the invention has the following characteristics. A second semiconductor region of a second conductivity type is selectively provided in a surface layer of one main surface of a semiconductor substrate of a first conductivity type which will be a first semiconductor region. A third semiconductor region of the first conductivity type which has a higher impurity concentration than the first semiconductor region is selectively provided in the second semiconductor region. A first electrode is provided on a surface of a portion, which is interposed between the third semiconductor region and the first semiconductor region, in the second semiconductor region, with an insulating film interposed therebetween. A second electrode comes into contact with the third semiconductor region and the second semiconductor region. A fourth semiconductor region of the second conductivity type is provided in a surface layer of the other main surface of the semiconductor substrate. A third electrode comes into contact with the fourth semiconductor region. A fifth semiconductor region of the first conductivity type is provided in the first semiconductor region which is close to the fourth semiconductor region and faces at least a portion of a first-semiconductor-region-side surface of the fourth semiconductor region. The fifth semiconductor region has a higher impurity concentration than the first semiconductor region. A sixth semiconductor region of the second conductivity type is provided in an outer circumferential portion of the semiconductor substrate. The sixth semiconductor region extends from the one main surface of the semiconductor substrate to the fourth semiconductor region through the first semiconductor region. A total dose of a first-conductivity-type impurity in the fifth semiconductor region is equal to or less than $2.0 \times 10^{12}$ cm$^{-2}$.

A semiconductor device according to another aspect of the invention has the following characteristics. A second semiconductor region of a second conductivity type is selectively provided in a surface layer of one main surface of a semiconductor substrate of a first conductivity type which will be a first semiconductor region. A third semiconductor region of the first conductivity type that has a higher impurity concentration than the first semiconductor region is selectively provided in the second semiconductor region. A trench extends from the one main surface of the semiconductor substrate to the first semiconductor region through the third semiconductor region and the second semiconductor region. An insulating film is provided along an inner wall of the trench. A first electrode is provided in the trench through the insulating film. A second electrode comes into contact with the third semiconductor region and the second semiconductor region. A fourth semiconductor region of the second conductivity type is provided in a surface layer of the other main surface of the semiconductor substrate. A third electrode comes into contact with the fourth semiconductor region. A fifth semiconductor region of the first conductivity type is provided in the first semiconductor region which is close to the fourth semiconductor region and faces at least a portion of a first-semiconductor-region-side surface of the fourth semiconductor region. The fifth semiconductor region has a higher impurity concentration than the first semiconductor region. A sixth semiconductor region of the second conductivity type is provided in an outer circumferential portion of the semiconductor substrate. The sixth semiconductor region extends from the one main surface of the semiconductor substrate to the fourth semiconductor region through the first semiconductor region. A total dose of a first-conductivity-type impurity in the fifth semiconductor region is equal to or less than $2.0 \times 10^{12}$ cm$^{-2}$.

In the semiconductor device according to the above-mentioned aspect of the invention, the fifth semiconductor region may face the entire first-semiconductor-region-side surface of the fourth semiconductor region.

In the semiconductor device according to the above-mentioned aspect of the invention, an active region including the second semiconductor region, the third semiconductor region, the fourth semiconductor region, the first electrode, the second electrode, and the third electrode is provided. A edge termination structure region is provided in the surface layer of the one main surface of the semiconductor substrate so as to surround the active region. The edge termination structure region may include a plurality of seventh semiconductor regions of the second conductivity type.

In the semiconductor device according to the above-mentioned aspect of the invention, the first semiconductor region may have sufficient resistivity to prevent a depletion layer, which is spread from the second semiconductor region to the fifth semiconductor region when a reverse rated voltage is applied using the second electrode as a positive electrode, from reaching the fifth semiconductor region.

According to the invention, since the fifth semiconductor region is provided, it is possible to achieve uniformity of the electric field intensity of the semiconductor substrate when the reverse voltage is applied. Therefore, it is possible to improve the reverse breakdown voltage. In addition, according to the invention, since the fifth semiconductor region is provided in the first semiconductor region so as to be close to the fourth semiconductor region, a neutral region remains between the fifth semiconductor region and the fourth semiconductor region when the forward voltage is applied, which makes it possible to suppress the oscillation of the voltage waveform and the current waveform when the semiconductor device is turned off.

According to the semiconductor device of the invention, it is possible to provide a semiconductor device which can improve a reverse breakdown voltage and a forward breakdown voltage, suppress the oscillation of a voltage waveform and a current waveform when the semiconductor device is turned off, and suppress the oscillation of the voltage waveform and the current waveform during reverse recovery.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
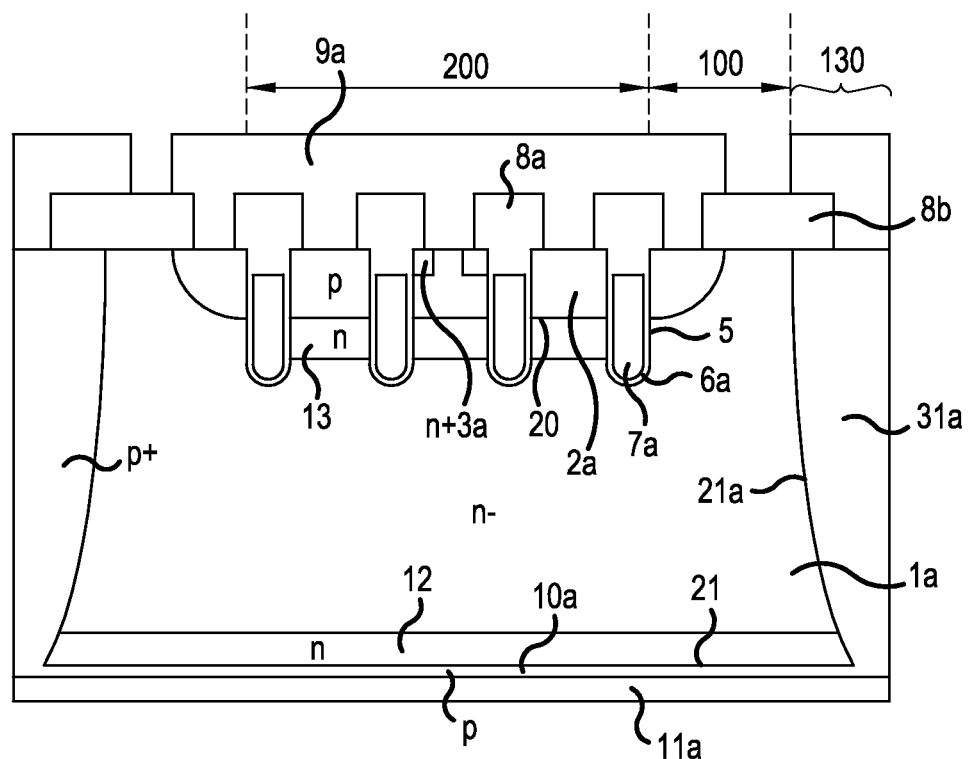
FIG. 1 is a cross-sectional view illustrating the structure of a reverse blocking IGBT according to Embodiment 1 of the invention.

Hereinafter, preferred embodiments of a semiconductor device according to the invention will be described in detail with reference to the accompanying drawings. In the following description, a reverse blocking IGBT is given as an example of a reverse blocking semiconductor device, a first conductivity type is an n type, and a second conductivity type is a p type. In the specification and the accompanying drawings, in the layers or regions having "n" or "p" appended thereto, an electron or a hole means a majority carrier. In addition, symbols "+" and "−" added to n or p mean that impurity concentration is higher and lower, respectively, than that of the layer without the symbols. In the description of the following embodiments and the accompanying drawings, the same components are denoted by the same reference numerals and the description thereof will not be repeated. In addition, in the accompanying drawings described in the following embodiments, scales and dimensions are different from the actual scales and dimensions for ease of illustration or ease of understanding. The invention is not limited to the following embodiments as long as it does not depart from the scope and spirit thereof.

Embodiment 1

A reverse blocking IGBT will be described as an example of a semiconductor device according to Embodiment 1. FIG. 1 is a cross-sectional view illustrating the structure of the reverse blocking IGBT according to Embodiment 1 of the invention. As illustrated in FIG. 1, the reverse blocking IGBT includes an active region 200, an edge termination structure region 100 that is provided outside the active region 200, and a separation portion 130 that is provided outside the edge termination structure region 100, which are provided on an FZ silicon substrate (semiconductor substrate) that will be an $n^-$ drift region 1a. The thickness of the semiconductor substrate may be, for example, equal to or greater than 90 µm in order to prevent an adverse effect on the characteristics of the reverse blocking IGBT with a breakdown voltage of 600 V and the thickness of the $n^-$ drift region 1a may be equal to or greater than 80 µm. A vertical reverse blocking IGBT including a trench gate MOS structure that is provided in a portion of the $n^-$ drift region 1a close to the front surface of the substrate, and a p collector region 10a and a collector electrode 11a that are provided in a portion of the $n^-$ drift region 1a close to the rear surface of the substrate, are provided in the active region 200. The trench gate MOS structure will be described in detail below.

An edge termination structure that is provided in a portion of the edge termination structure region 100 close to the front surface of the substrate includes a predetermined pattern that is provided between the active region 200 and the separation portion 130 so as to surround the active region 200. The edge termination structure region 100 has a function of reducing the electric field intensity of a main pn junction termination surface forming the IGBT to obtain the desired breakdown voltage and breakdown voltage reliability. The main pn junction means a pn junction (p base junction) between a p base region 2a and the $n^-$ drift region 1a. The edge termination structure of the edge termination structure region 100 will be described below. The separation portion 130 has a cut surface which is a side surface of the semiconductor substrate when a wafer is diced into individual chips and is formed along the cut surface. Therefore, the separation portion 130 needs to have a sufficient width to prevent a crystal defect in the cut surface from having an adverse effect on at least the edge termination structure region 100. The separation portion 130 includes an isolation region 31a which is an end portion provided on the outer circumferential side of the $n^-$ drift region 1a and has a depth ranging from the front surface of the substrate to the p collector region 10a provided on the rear surface of the substrate in the $n^-$ drift region 1a. When a reverse voltage is applied, a depletion layer is spread from a collector junction (a pn junction between the p collector region 10a and the $n^-$ drift region 1a) 21 on the rear surface side of the semiconductor substrate and a pn junction (hereinafter, referred to as a isolation region junction) 21a between the isolation region 31a and the $n^-$ drift region 1a to the p base region 2a. Therefore, when the reverse voltage is applied, the depletion layer is prevented from reaching the side surface of the semiconductor substrate and the generation of a leakage current is prevented. As a result, it is possible to obtain a reverse breakdown voltage.

Figure 2:
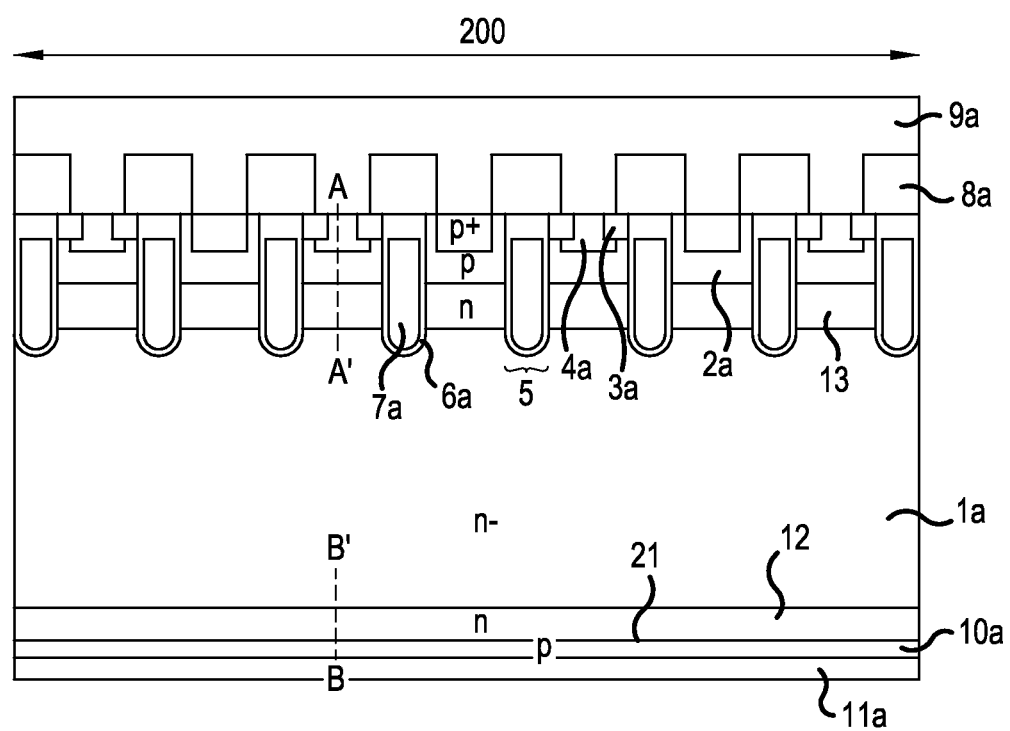
FIG. 2 is a cross-sectional view illustrating the structure of an active region of the reverse blocking IGBT illustrated in FIG. 1.

Next, the structure of the active region 200 will be described in detail. FIG. 2 is a cross-sectional view illustrating the structure of the active region 200 of the reverse blocking IGBT illustrated in FIG. 1. In the active region 200, a plurality of first trenches 5 are provided at predetermined intervals in the front surface of the semiconductor substrate which will be the $n^-$ drift region 1a. The p base region 2a is provided in a surface layer of the front surface of the semiconductor substrate so as to be interposed between the first trenches 5. The p base region 2a has a higher impurity concentration than the $n^-$ drift region 1a. In a portion interposed between adjacent first trenches 5, an $n^+$ emitter region 3a and a $p^+$ body region 4a are selectively provided in a surface layer of the p base region 2a close to the front surface of the substrate. The $p^+$ body region 4a has a higher impurity concentration than the p base region 2a. In a portion of the p base region 2a interposed between adjacent first trenches 5, a structural portion in which the $n^+$ emitter region 3a and the $p^+$ body region 4a are provided, and a structural portion in which the $n^+$ emitter region 3a is not provided, are alternately arranged.

An n shell region 13 is provided between the $n^-$ drift region 1a and the p base region 2a so as to be interposed between the first trenches 5. The n shell region 13 may be provided so as to occupy the entire region below at least the p base region 2a (the side of the $n^-$ drift region 1a). In this case, it is possible to suppress the injection of a minority carrier from the p collector region 10a to the p base region 2a and to reduce transport efficiency. Preferably, the n shell region 13 may be provided so as to surround the entire region below the p base region 2a in the active region 200. That is, a contact region between the p base region 2a and the $n^-$ drift region 1a is completely removed, which makes it possible to reliably suppress the injection of the minority carrier from the p collector region 10a to the p base region 2a and to reduce transport efficiency. In FIG. 2, the entire n shell region 13 is interposed between the first trenches 5. However, a portion of the n shell region 13 may be interposed between the first trenches 5 and another portion thereof may have a depth (a depth which covers the bottom of the first trench 5) which reaches a lower layer of the first trench 5. The emitter electrode 9a comes into common contact with the surface of the $n^+$ emitter region 3a and the surface of the $p^+$ body region 4a. In addition, the emitter electrode 9a is electrically insulated from a gate electrode 7a by an interlayer insulating film 8a.

The structure of the first trench 5 will be further described. The first trench 5 needs to have a sufficient depth to pass through the $n^+$ emitter region 3a and the p base region 2a. The first trench 5 may have a depth that reaches the middle of the n shell region 13 or a depth that passes through the n shell region 13. Similarly to the related art, in the MOS gate structure (trench gate MOS structure) formed in the first trench 5, a gate insulating film 6a may be provided along the inner wall of the first trench 5 and the gate electrode 7a which is made of polysilicon may be provided in the first trench 5 through the gate insulating film 6a.

The n shell region 13 has a higher impurity concentration than the $n^-$ drift region 1a. Preferably, the $n^-$ drift region 1a has resistivity satisfying the condition that the depletion layer which is spread from the p collector region 10a to the n shell region 13 does not reach the n shell region 13. The $n^-$ drift region 1a needs to have at least resistivity that prevents the depletion layer, which is spread from the p collector region 10a to the n shell region 13 when a reverse voltage equal to the rated voltage is applied, from reaching the n shell region 13. The resistivity of the $n^-$ drift region a may be in the range of, for example, 22 Ωcm to 35 Ωcm and the width (thickness) of the $n^-$ drift region 1a may be in the range of, for example, 80 µm to 100 µm, in order to achieve the breakdown voltage of a reverse blocking IGBT with a rated voltage of 600 V using the lowest on-voltage. In this case, it is possible to prevent the depletion layer from reaching the n shell region 13 when the reverse voltage is recovered.

On the rear surface side of the semiconductor substrate, an n leakage current stop (LCS) region 12 which comes into contact with the p collector region 10a is provided between the n⁻ drift region 1a and the p collector region 10a. The n LCS region 12 is provided in order to suppress the injection of the minority carrier from the p collector region 10a to the n LCS region 12 and to reduce transport efficiency. The n LCS region 12 has a function of reducing a leakage current.

The n LCS region 12 has a higher impurity concentration than the n⁻ drift region 1a. The n⁻ drift region 1a has sufficient resistivity to prevent the depletion layer, which is spread from the p base region 2a to the n LCS region 12 when a forward voltage, preferably, a forward voltage equal to the rated voltage is applied, from reaching the n LCS region 12. The n LCS region 12 has impurity concentration at which the effective dose of n-type impurities in the n LCS region 12 (hereinafter, referred to as the effective dose of the n LCS region 12) is equal to or less than $5.0 \times 10^{12}$ cm$^{-2}$. The impurity concentration of the n LCS region 12 may be set such that the average of the effective dose of the n-type impurities in the entire n LCS region 12 is equal to or less than $5.0 \times 10^{12}$ cm$^{-2}$ even when the effective dose of the n LCS region 12 is unevenly distributed in the n LCS region 12. The n LCS region 12 does not need to have a specified impurity concentration distribution. It is preferable that the n LCS region 12 have an impurity concentration at which the effective dose of the n LCS region 12 is equal to or less than $4.0 \times 10^{12}$ cm$^{-2}$. In this case, it is possible to reduce the sum of reverse recovery loss (switching loss when the reverse voltage is recovered) and turn-on loss which are unique to the reverse blocking IGBT.

Figure 3:
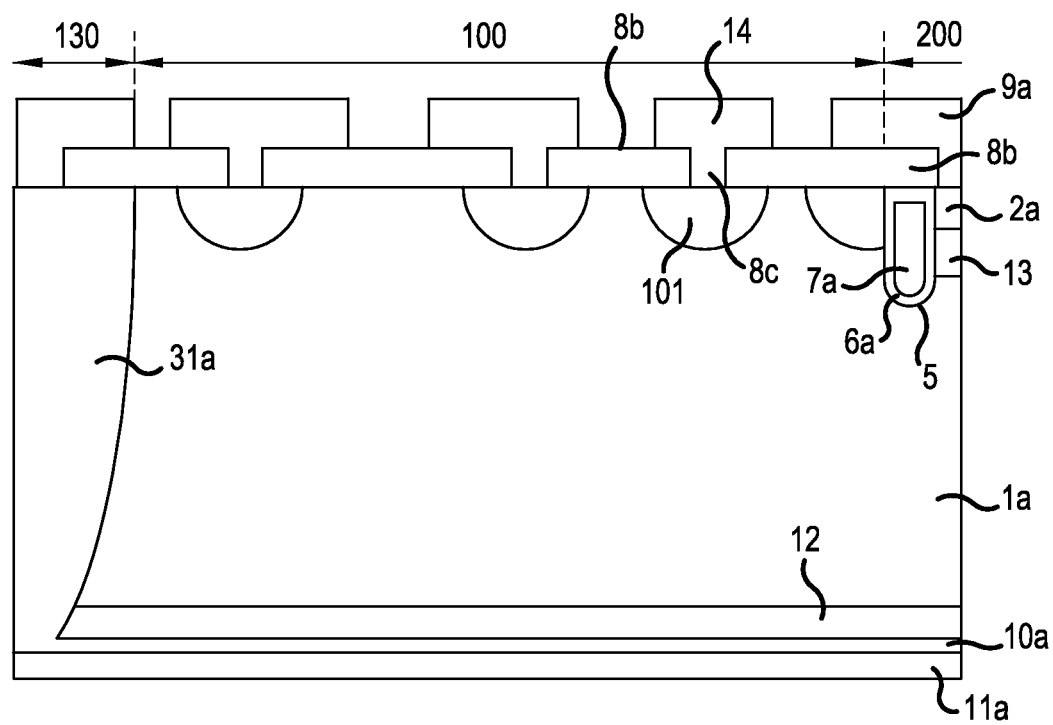
FIG. 3 is a cross-sectional view illustrating the structure of an edge termination structure region of the reverse blocking IGBT illustrated in FIG. 1.

Next, the structure of the edge termination structure region 100 will be described. FIG. 3 is a cross-sectional view illustrating the structure of the edge termination region 100 in the reverse blocking IGBT illustrated in FIG. 1. The edge termination structure region 100 is formed in a ring-shaped plane pattern in the circumference of the active region 200. Specifically, a field insulating film 8b which covers the n⁻ drift region 1a is provided as a breakdown voltage protection film on a surface of the edge termination structure region 100 which is close to the front surface of the substrate in the n⁻ drift region 1a. A plurality of field limiting rings (hereinafter, referred to as FLRs) 101, which are electrical floating p-type regions, are formed in a ring-shaped plane pattern in the surface layer of the front surface of the substrate so as to surround the surface layer of the active region 200 in the n⁻ drift region 1a which is a lower layer of the field insulating film 8b. Opening portions 8c through which the surfaces of the FLRs 101 are exposed in the ring-shaped plane pattern are provided in the field insulating film 8b. Field plates (hereinafter, referred to as FPs) 14, which are floating conductive films, are provided on a plurality of FLRs 101 through the opening portions 8c in the field insulating film 8b along the surface shape of the FLRs 101.

Figure 4A:
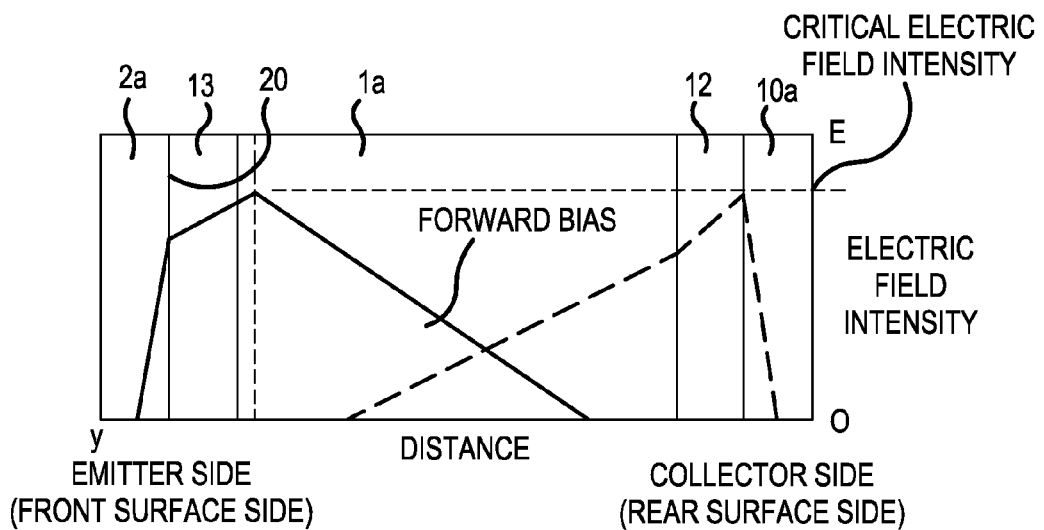
FIGS. 4A to 4C are characteristic diagrams illustrating an electric field intensity distribution in the active region of the reverse blocking IGBT according to Embodiment 1 of the invention.
Figure 4B:
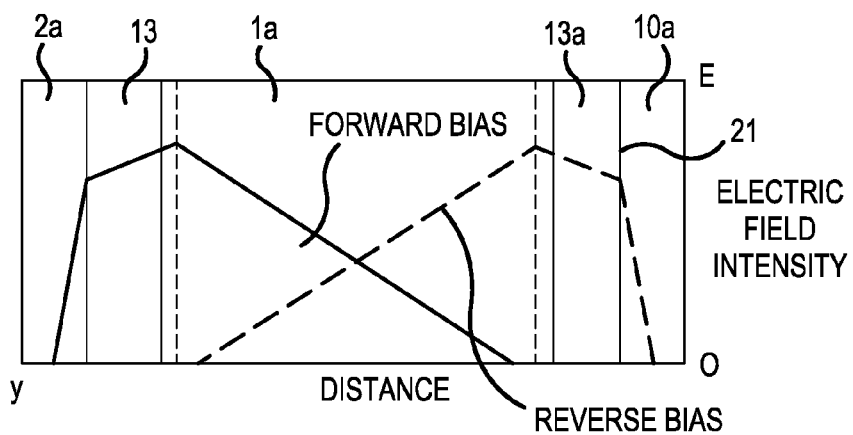
Figure 4C:
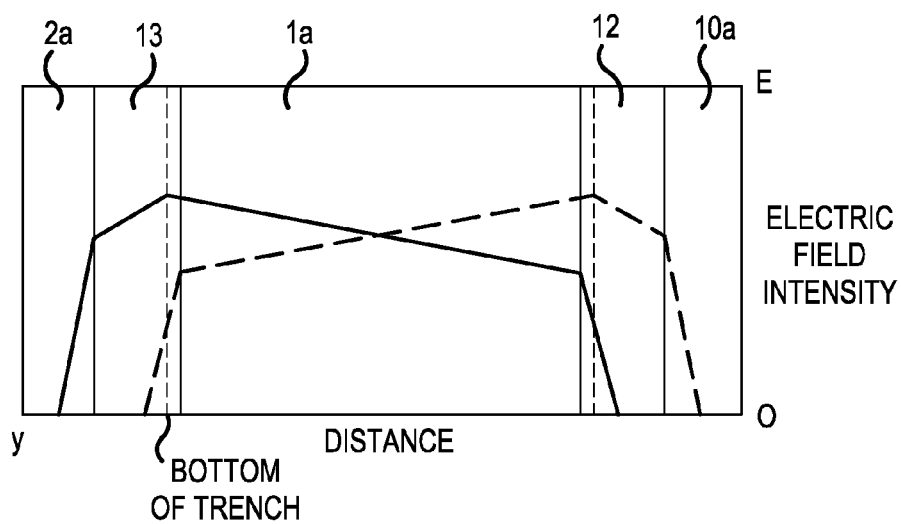
Figure 14:
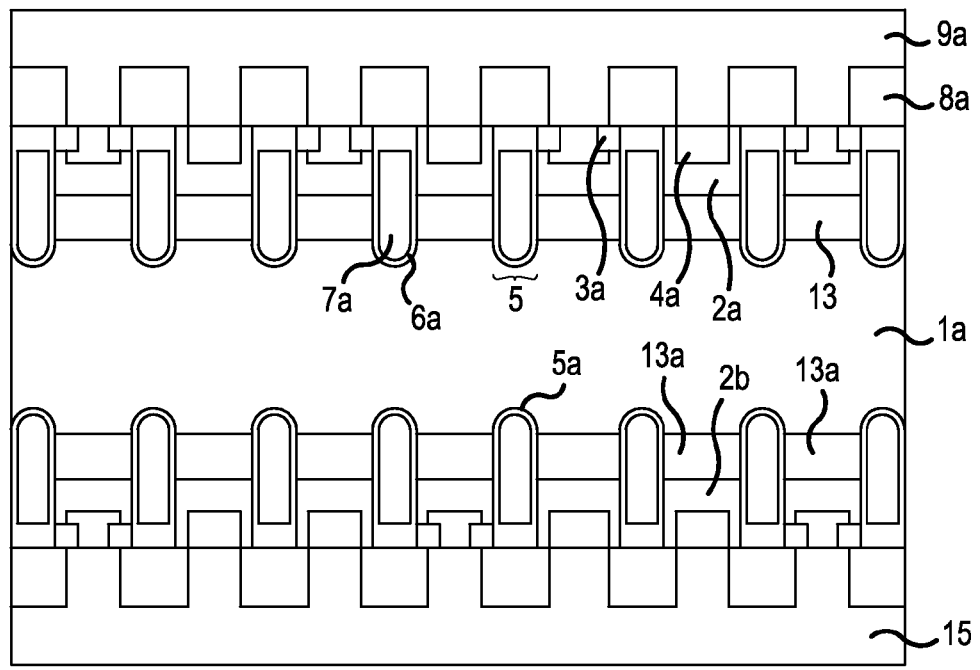
FIG. 14 is a cross-sectional view illustrating another example of the reverse blocking IGBT according to Embodiment 1.
Figure 15:
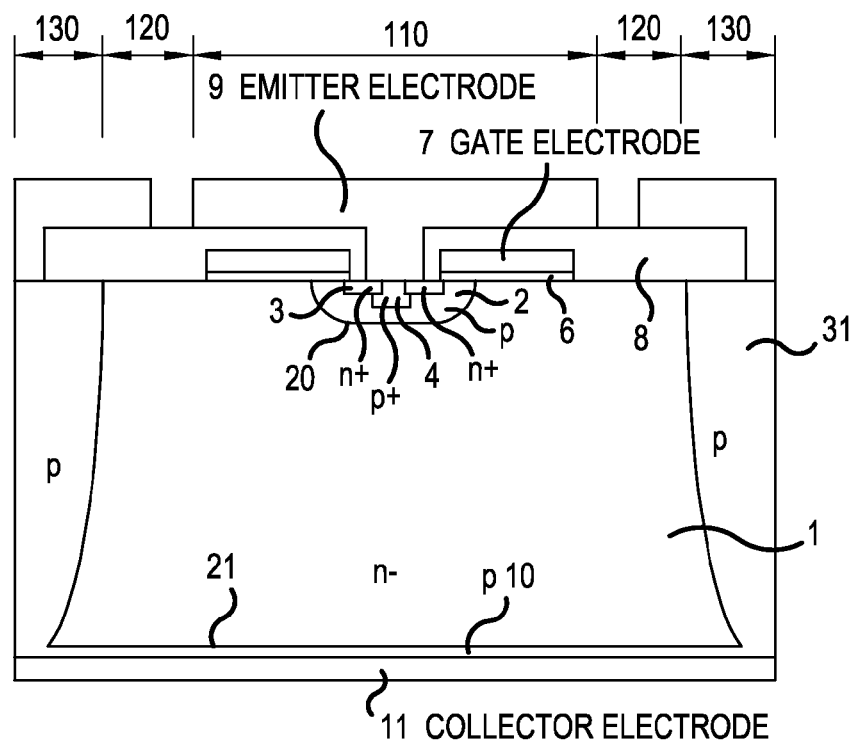
FIG. 15 is a cross-sectional view schematically illustrating the structure of the reverse blocking IGBT according to the related art.
Figure 16:
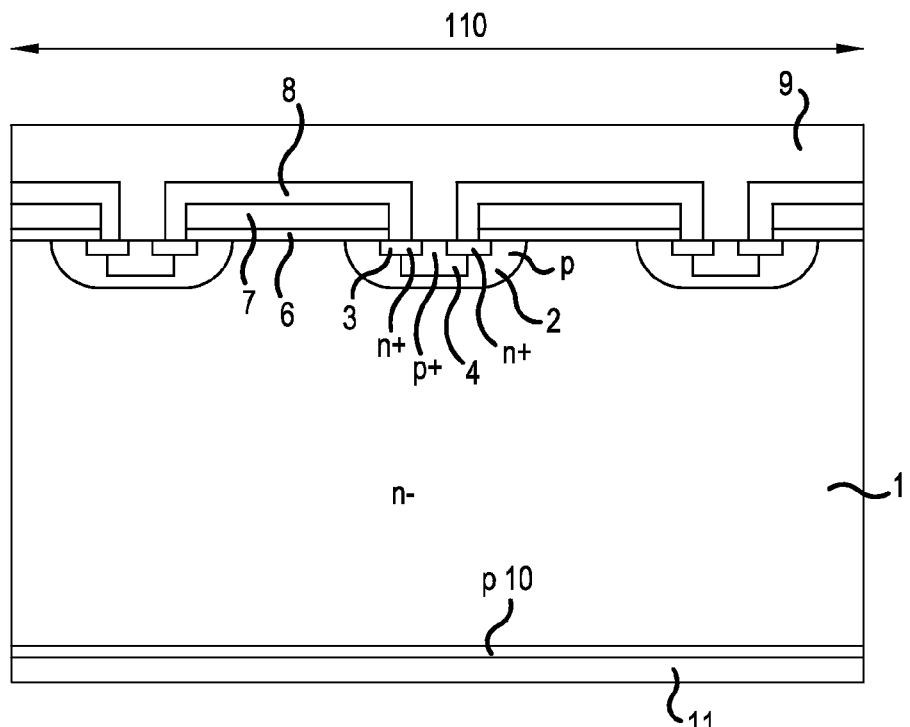
FIG. 16 is a cross-sectional view illustrating the detailed structure of an active region of the reverse blocking IGBT according to the related art illustrated in FIG. 15.

Next, the electric field intensity distribution of the reverse blocking IGBT according to Embodiment 1 will be described. FIG. 4 is a characteristic diagram illustrating the electric field intensity distribution in the active region of the reverse blocking IGBT according to Embodiment 1 of the invention. FIG. 14 is a cross-sectional view illustrating another example of the reverse blocking IGBT according to Embodiment 1. FIG. 4 illustrates the electric field intensity distribution (FIG. 4A) of the reverse blocking IGBT according to Embodiment 1 illustrated in FIGS. 1 and 2 and the electric field intensity distribution (FIGS. 4B and 4C) of the bidirectional IGBT disclosed in JP 2002-246597 A illustrated in FIG. 14. FIGS. 4A and 4B are electric field intensity distribution characteristic diagrams illustrating the relationship between a distance y from the surface of the p collector region 10a (the interface between the p collector region 10a and the collector electrode 11a) and electric field intensity E (which holds for FIG. 4C).

Figure 17A:
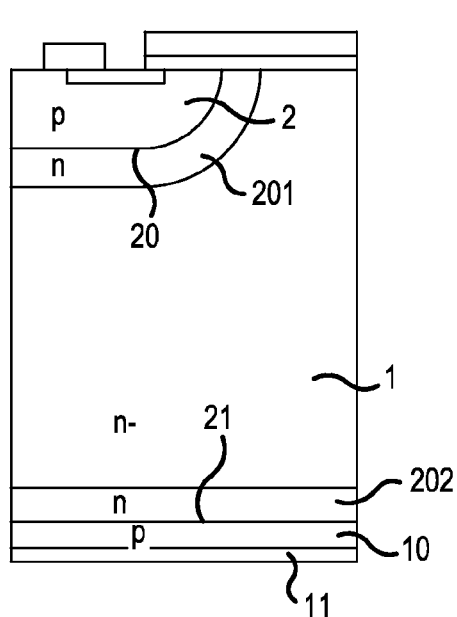
FIGS. 17A and 17B are diagrams illustrating the electric field intensity distributions of the reverse blocking IGBT according to the related art when a forward voltage is applied and when a reverse voltage is applied.
Figure 17B:
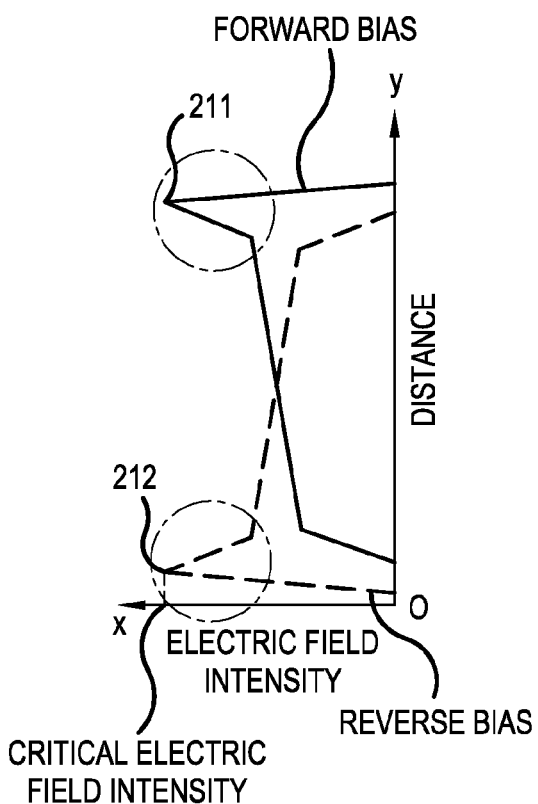

As illustrated in FIG. 4A, in the reverse blocking IGBT according to Embodiment 1 illustrated in FIGS. 1 and 2, since the first trench 5 passes through the n shell region 13, the peak of the electric field (critical electric field intensity) when a forward bias is applied (a forward voltage is applied: a solid line in FIG. 4A) is not disposed in the vicinity of the p base junction 20, unlike an electric field peak 211 in the reverse blocking IGBT according to the related art illustrated in FIG. 17B, but is disposed at the bottom of the first trench 5 (a dashed line parallel to the shell region) in the vicinity of the boundary between the n shell region 13 and the n⁻ drift region 1a in the n⁻ drift region 1a. In addition, the reverse blocking IGBT according to Embodiment 1 is characterized in that the inclination of the electric field intensity before and after the peak of the electric field is less than the inclination of the electric field intensity before and after the electric field peak 211 in the structure according to the related art illustrated in FIG. 17B.

In the reverse blocking IGBT according to Embodiment 1, the inclination of the electric field intensity before and after the peak of the electric field generated in the vicinity of the boundary between the p collector region 10a and the n LCS region 12 when a reverse bias is applied (a reverse voltage is applied: an inclined dashed line in FIG. 4A) is less than the inclination of the electric field intensity before and after an electric field peak 212 in the structure according to the related art illustrated in FIG. 17B, similarly to when the forward bias is applied (the direction in which the peak of the electric field is generated is opposite to that when the forward bias is applied). When the reverse bias is applied, the emitter side of the electric field intensity distribution does not reach the n shell region 13, but is in the n⁻ drift region 1a. This illustrates that the electric field intensity reaches an avalanche breakdown electric field before the depletion layer which is spread from the collector junction 21 to the emitter direction reaches the n shell region 13.

In the bidirectional IGBT having the trench gate MOS structures on two main surfaces of the substrate illustrated in FIG. 14, first and second shell regions (n shell regions) 13 and 13a are provided in a narrow region interposed between the first trenches 5 and a narrow region interposed between the second trenches 5a on the two main surfaces of the substrate, respectively. Therefore, as illustrated in FIG. 4B, both when the forward voltage is applied and when the reverse voltage is applied, the position of the peak of the electric field is moved to the position of the bottoms of the first and second trenches 5 and 5a in the vicinity of the boundaries between the first and second shell regions 13 and 13a and the n⁻ drift region 1a (dashed lines parallel to the shell regions) and the inclination of the electric field intensity is less than that in the structure according to the related art illustrated in FIG. 17. It was verified that the depletion layer (inclined solid line) which was spread from the p base junction 20 to the p collector region 10a (corresponding to a p base region 2b illustrated in FIG. 14) reached the critical electric field intensity causing avalanche breakdown before it reached the second shell region 13a. In addition, it was verified that the depletion layer (inclined dashed line) which was spread from the collector junction 21 to the first shell region 13 reached the critical electric field intensity causing the avalanche breakdown before it reached the first shell region 13. In FIG. 14, the n shell region 13 on the front surface side of the substrate is the first shell region and the n shell region on the rear surface side of the substrate is the second shell region 13a. The trench 5a which forms the trench gate MOS structure on the rear surface side of the substrate is the second trench. The structure of another example of the reverse blocking IGBT according to Embodiment 1 illustrated in FIG. 14 will be described below.

As described above, when the n shell region 13 is provided between the p base region 2a and the n⁻ drift region 1a so as to be interposed between the first trenches 5, the inclination of the electric field intensity before and after the peak of the electric field is reduced. The reason is as follows. When the reverse bias is applied to the p base junction 20, the n shell region 13 between the first narrow trenches 5 is not only depleted from the pn junction with the p base region 2a, but also is depleted from the boundaries between the gate insulating films 6a in the first trenches 5 which have the n shell region 13 interposed therebetween. Therefore, even when the impurity concentration of the n shell region 13 is high, the n shell region 13 is likely to be fully depleted at a low forward bias. Then, an equipotential interval increases and the increasing rate of the electric field intensity is reduced. As a result, the inclination of the electric field intensity before and after the peak of the electric field is reduced. The first narrow trenches 5 are arranged at a trench interval of, for example, 4 μm to 5 μm.

In the reverse blocking IGBT according to the invention, the n shell region 13 is provided under the above-mentioned conditions such that the above-mentioned electric field intensity distribution is obtained. In the bidirectional IGBT according to the invention, the first shell region 13 or the second shell region 13a is provided under the above-mentioned conditions such that the above-mentioned electric field intensity distribution is obtained. In addition, in the reverse blocking IGBT and the bidirectional IGBT according to the invention, the n⁻ drift region 1a is provided under the condition that the depletion layer is not fully depleted in the n⁻ drift region 1a when the rated voltage is applied, as described above.

Figure 5:
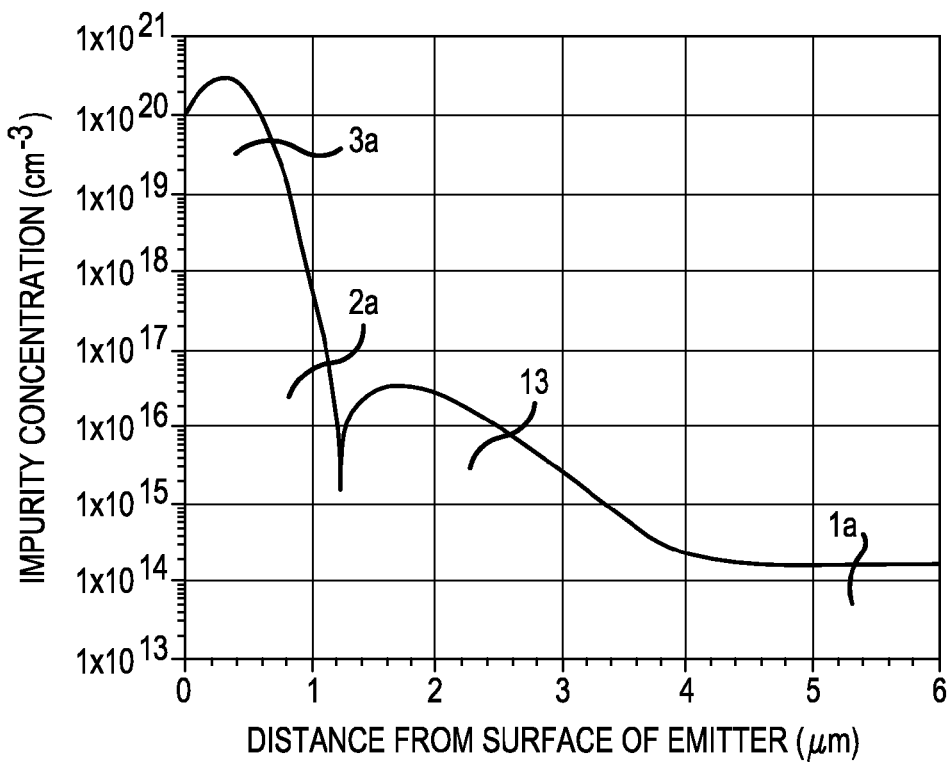
FIG. 5 is a characteristic diagram illustrating the distribution of an effective dose along the cutting line A-A' of FIG. 2.
Figure 6:
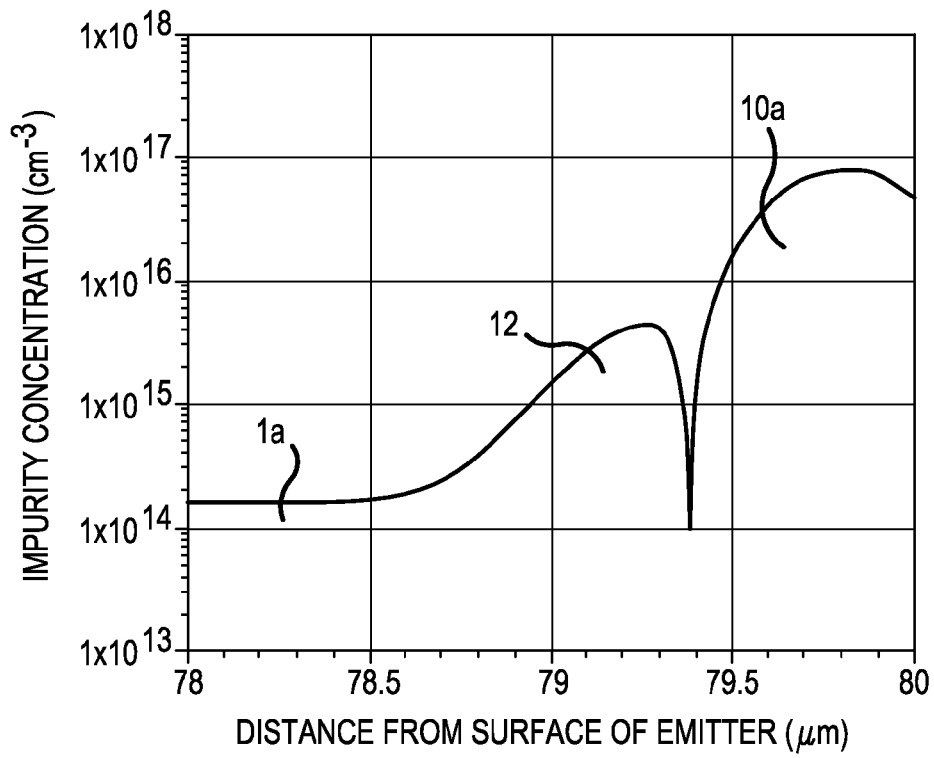
FIG. 6 is a characteristic diagram illustrating the distribution of the effective dose along the cutting line B-B' of FIG. 2.

Then, the current characteristics of the reverse blocking IGBT (hereinafter, referred to as a first example) according to Embodiment 1 illustrated in FIGS. 1 and 2 were verified. In the first example, the rated voltage was 600 V. The resistivity and thickness of the semiconductor substrate were 28 Ωcm and 80 μm, respectively. That is, the resistivity of the n⁻ drift region 1a is 28 Ωcm. The first trench 5 had a width of 1.5 μm and a depth of 5.0 μm and the first trenches 5 were arranged at an interval of 4.5 μm. Next, the current characteristics of the first example will be described with reference to FIGS. 5 to 10. FIG. 5 is a characteristic diagram illustrating an effective dose distribution along the cutting line A-A' of FIG. 2. In FIG. 5, the vertical axis is impurity concentration (cm⁻³) and the horizontal axis is the distance (μm) from the surface of the emitter (which holds for FIGS. 6 and 22). The surface of the emitter means the boundary between the n emitter region 3a and the emitter electrode 9a, that is, the front surface of the semiconductor substrate. FIG. 6 is a characteristic diagram illustrating an effective dose distribution along the cutting line B-B' of FIG. 2. The impurity concentration indicated by the vertical axis of FIG. 5 indicates the effective dose of a region per unit volume at a given depth (cutting line A-A') from the front surface of the semiconductor substrate. The impurity concentration indicated by the vertical axis of FIG. 6 indicates the effective dose of a region per unit area at a given distance in the direction from the n⁻ drift region 1a to the p body region 4a. The effective dose of the region corresponding to the n shell region 13 at each depth was integrated to calculate the effective impurity concentration of the n shell region 13. That is, a region in the shape of the distribution of the effective dose of the n shell region 13 illustrated in FIG. 5 is the effective dose of the n shell region 13.

Figure 7:
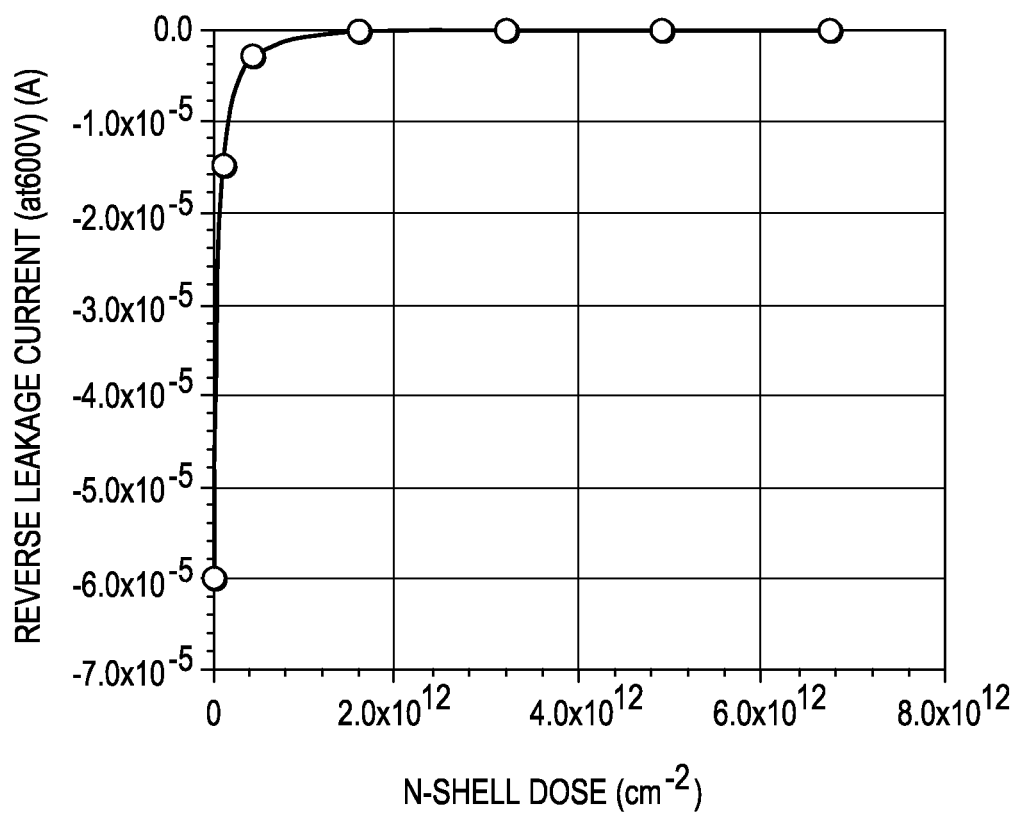
FIG. 7 is a characteristic diagram illustrating the relationship between a reverse leakage current and the effective dose of an n shell region in the reverse blocking IGBT according to Embodiment 1.

The effective dose of the n⁻ drift region 1a per unit area means the effective dose of the n⁻ drift region 1a per unit area in a portion of the n⁻ drift region 1a in which the n shell region 13 is provided. The effective dose of the n⁻ drift region 1a per unit area is calculated by the same method as that used to calculate the effective dose of the n shell region 13. FIG. 7 is a characteristic diagram illustrating the relationship between the effective dose of the n shell region 13 and a reverse leakage current in the reverse blocking IGBT according to Embodiment 1. A plurality of first examples with different effective doses (N-Shell Dose) of the n shell region 13 were produced (manufactured). The effective doses of the n shell region 13 were in the range of $1 \times 10^{11}$ cm⁻² to $6.8 \times 10^{12}$ cm⁻². Then, in the first examples, the reverse leakage current was measured. For comparison, a reverse blocking IGBT without the n shell region (hereinafter, referred to as a comparative example) was prepared and the reverse leakage current was measured.

In FIG. 7, the horizontal axis is the effective dose of the n shell region 13, in order to illustrate the reverse leakage current according to the comparative example in which the effective dose is zero and to illustrate the reverse leakage current (the vertical axis) according to the plurality of first examples with different effective doses of the n shell region 13. The thickness of the n⁻ drift region 1a is 80 μm. The result illustrated in FIG. 7 proved that the leakage current of the comparative example was $6.0 \times 10^{-5}$ A (0.06 mA) at 600 V. In contrast, in the first example provided with the n shell region 13 with a surface impurity concentration of $1.8 \times 10^{12}$ cm⁻³ or more, it was verified that, even when the thickness of the n⁻ drift region 1a was small (80 μm), it was possible to substantially reduce the reverse leakage current to about zero. In addition, in the first example, it was verified that, as the effective dose of the n shell region 13 increased, the reverse leakage current could be reduced. The reason is that, since the n shell region 13 is provided between the n⁻ drift region 1a and the p base region 2a, the current gain of the pnp transistor including the p collector region 10a, the n⁻ drift region 1a, and the p base region 2a (p⁺ body region 4a) is reduced. In the comparative example in which the thickness of the n⁻ drift region 1a was 100 μm and the effective dose was zero, it was verified that the leakage current was $1.1 \times 10^{-}$A (0.011 mA) at 600 V.

Figure 8:
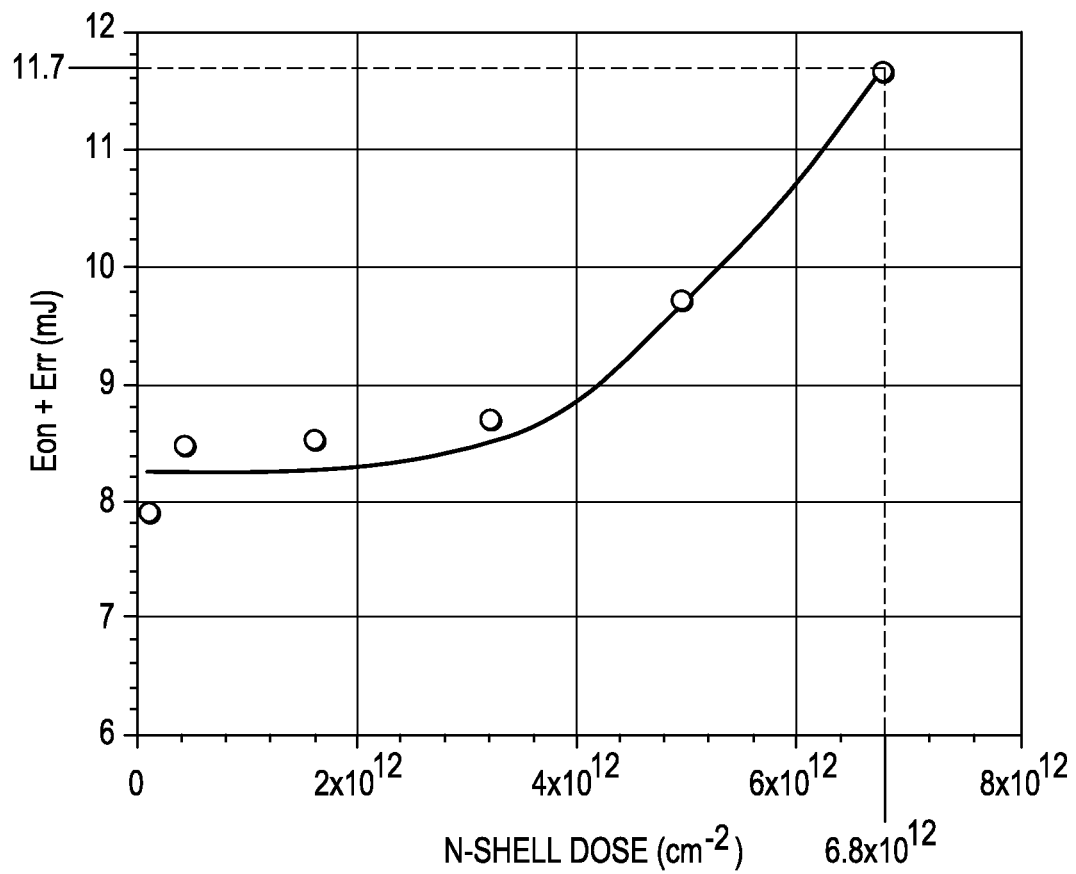
FIG. 8 is a characteristic diagram illustrating the relationship between the sum of turn-off loss and turn-on loss and the effective dose of the n shell region in the reverse blocking IGBT according to Embodiment 1.

Next, the relationship between the effective dose (N-Shell Dose) of the n shell region 13 and the sum of turn-off loss (Eoff: reverse recovery loss) and turn-on (Eon) loss will be described. FIG. 8 is a characteristic diagram illustrating the relationship between the effective dose of the n shell region 13 and the sum of the turn-off loss and the turn-on loss in the reverse blocking IGBT according to Embodiment 1. When the reverse blocking IGBT is connected in inverse parallel and is used as a bidirectional switching device of a matrix converter, it is preferable that the reverse recovery loss or the turn-on loss be small since a stage which functions as a diode (free-wheel diode) for a reverse breakdown voltage is connected in series to the IGBT in a bidirectional switching device using the IGBT according to the related art. FIG. 8 illustrates the measurement results of the reverse recovery loss and the turn-on loss in the first example and the comparative example.

In FIG. 8, the sum (not illustrated) of the reverse recovery loss and the turn-on loss of the reverse blocking IGBT without the n shell region according to the comparative example corresponds to an effective zero N-Shell impurity dose.

In addition, the reverse recovery loss (turn-off loss) and the turn-on loss when a bus voltage was 300 V and a reverse recovery current was 180 A/cm$^{-2}$ were measured. The results illustrated in FIG. 8 proved that the n shell region 13 caused the sum of the turn-off loss and the turn-on loss to increase rapidly as the impurity dose increased. It is assumed that this is because the reverse recovery current increases as the effective dose of the n shell region 13 increases, resulting in an increase in the reverse recovery loss. Therefore, when the reverse blocking IGBT is used as a switching element, it is preferable to reduce the effective dose of the n shell region 13 in order to reduce switching loss. As can be seen from the results illustrated in FIG. 8, when the effective impurity dose of the n shell region 13 is equal to or less than $5.0 \times 10^{12}$ cm$^{-2}$ (preferably, equal to or less than $4.0 \times 10^{12}$ cm$^{-2}$), the sum of the reverse recovery loss and the turn-on loss is in the range of about 8 mJ to 9 mJ and an increase in the sum of the reverse recovery loss and the turn-on loss is relatively small. In contrast, in the reverse blocking IGBT according to the comparative example, the sum of the turn-off loss and the turn-on loss is about 13.5 mJ (not illustrated). Therefore, in the first example in which the effective impurity dose of the n shell region 13 is equal to or less than $5.0 \times 10^{12}$ cm$^{-2}$ (preferably, equal to or less than $4.0 \times 10^{12}$ cm$^{-2}$), the sum of the turn-off loss and the turn-on loss can be about 35% to 40% less than that in the comparative example.

In addition, as can be seen from FIG. 8, when the effective impurity dose of the n shell region 13 is greater than $5.0 \times 10^{12}$ cm$^{-2}$, the sum of the reverse recovery loss and the turn-on loss increases rapidly. For example, when the effective dose of the n shell region 13 is $6.8 \times 10^{12}$ cm$^{-2}$, the sum of the reverse recovery loss and the turn-on loss is about 11.7 mJ. In this case, the sum of the reverse recovery loss and the turn-on loss is less than that in the comparative example (13.5 mJ) and is about 30% to 46% more than that in the first example (about 8 mJ to 9 mJ) in which the effective dose of the n shell region 13 is equal to or less than $5.0 \times 10^{12}$ cm$^{-2}$. In the invention, there results proved that the preferred effective dose of the n shell region 13 was equal to or less than $5.0 \times 10^{12}$ cm$^{-2}$ and preferably, equal to less than $4.0 \times 10^{12}$ cm$^{-2}$.

Figure 9:
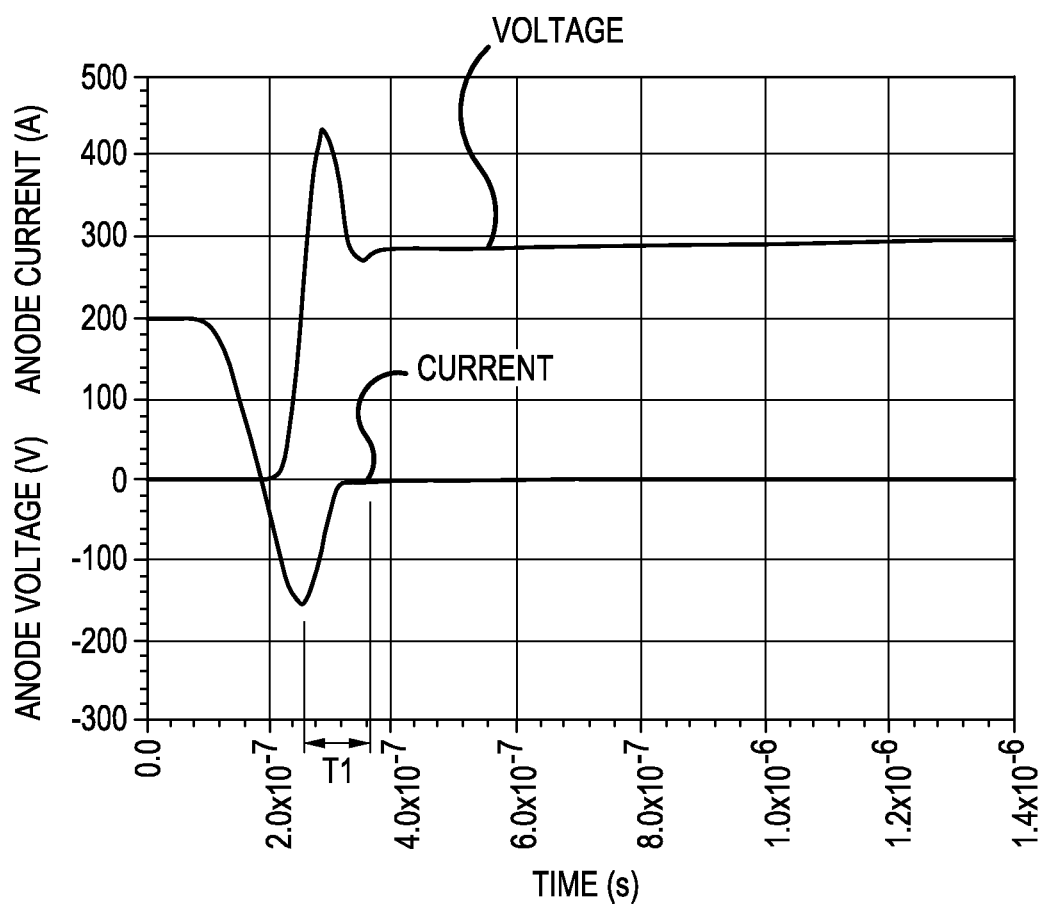
FIG. 9 is a characteristic diagram illustrating a voltage waveform and a current waveform during the reverse recovery of the reverse blocking IGBT according to Embodiment 1.
Figure 10:
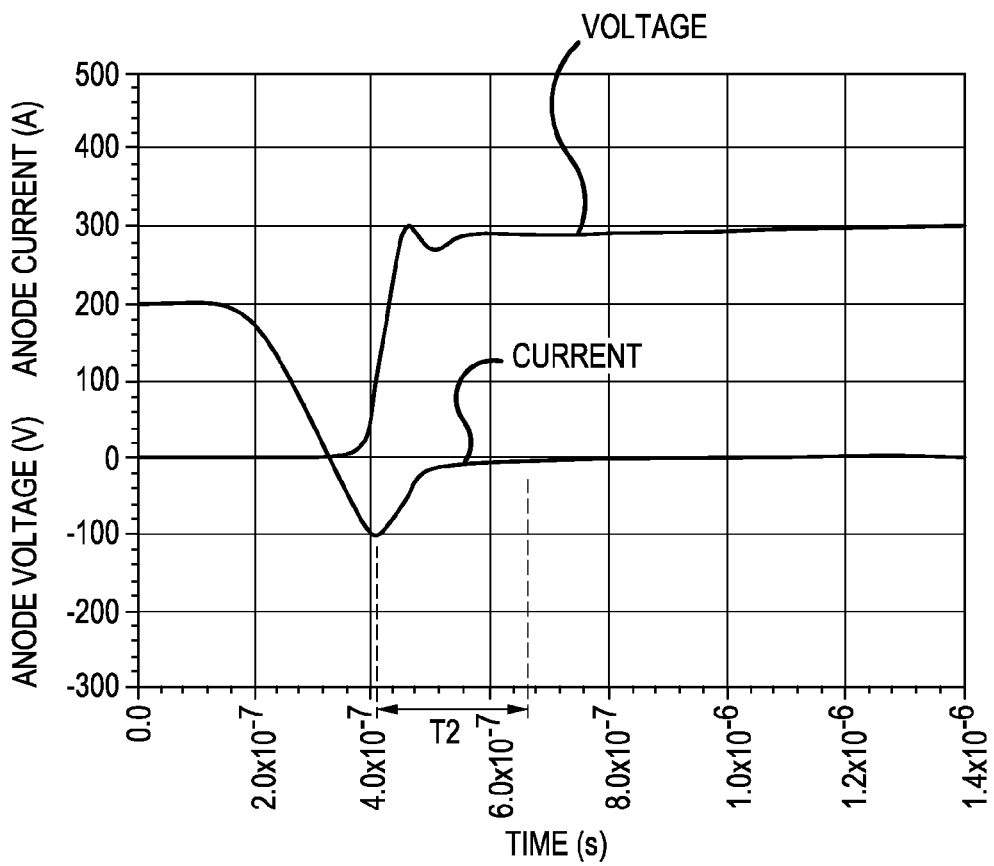
FIG. 10 is a characteristic diagram illustrating a voltage waveform and a current waveform during the reverse recovery of a reverse blocking IGBT according to the related art.

FIG. 9 is a characteristic diagram illustrating a voltage waveform and a current waveform during the reverse recovery of the reverse blocking IGBT according to Embodiment 1. FIG. 10 is a characteristic diagram illustrating a voltage waveform and a current waveform during the reverse recovery of the reverse blocking IGBT according to the related art. In FIGS. 9 and 10, the horizontal axis indicates time and the vertical axis indicates an anode current and an anode voltage. FIG. 9 illustrates a case in which the effective dose of the n shell region 13 according to the first example is $3.2 \times 10^{12}$ cm$^{-2}$. FIGS. 9 and 10 illustrate a reverse recovery waveform when the bus voltage is 300 V and the reverse recovery current is 180 A/cm$^{-2}$. As can been seen from these results, in the first example illustrated in FIG. 9, a period T1 (hereinafter, referred to as a convergence period) for which the reverse recovery current of the reverse recovery waveform converges from a negative value to zero is shorter than a convergence period T2 in the comparative example illustrated in FIG. 10. In other words, in the first example, the recovery of the blocking voltage is faster than that in the comparative example. In addition, as can be seen from the first example, the reverse recovery waveform did not oscillate.

It is assumed that the oscillation of the reverse recovery waveform does not occur in the first example because the minority carriers are stored in the n shell region 13 of a diode including the p base region 2a and the n shell region 13 when the diode is turned on, which prevents an increase in the amount of reverse recovery current. In addition, the reason is that the substrate concentration of the n$^-$ drift region 1a is adjusted such that a space-charge region (depletion layer) which extends from the p collector region 10a to the p base region 2a does not reach the n shell region 13 or the bottom of the first trench 5. Furthermore, it is assumed that the convergence period T1 for which the reverse recovery current is zero is short and the recovery of the blocking voltage is fast in the first example because the effective diffusion depth of the p base region 2a is reduced by the influence of the n shell region 13, resulting in a reduction in the channel length and a reduction in gate capacitance CGE.

As described above, in the reverse blocking IGBT according to Embodiment 1, the n shell region 13 with the impurity concentration in which the effective dose of n-type impurities is equal to or less than $5.0 \times 10^{12}$ cm$^{-2}$ is provided between the n$^-$ drift region 1a and the p base region 2a. In addition, the reverse blocking IGBT according to Embodiment 1 includes the n$^-$ drift region 1a with sufficient resistivity to prevent the depletion layer which is spread from the p collector region 10a from reaching the n shell region 13. Therefore, in the reverse blocking IGBT according to Embodiment 1, the electric field intensity in the substrate can be less than that in the reverse blocking IGBT according to the related art. As a result, it is possible to increase a forward breakdown voltage and a reverse breakdown voltage. In addition, according to Embodiment 1, it is possible to suppress the oscillation of the voltage waveform and the current waveform (reverse recovery waveform) during reverse recovery. Therefore, it is possible to prevent the generation of noise and the damage of the device.

Figure 11:
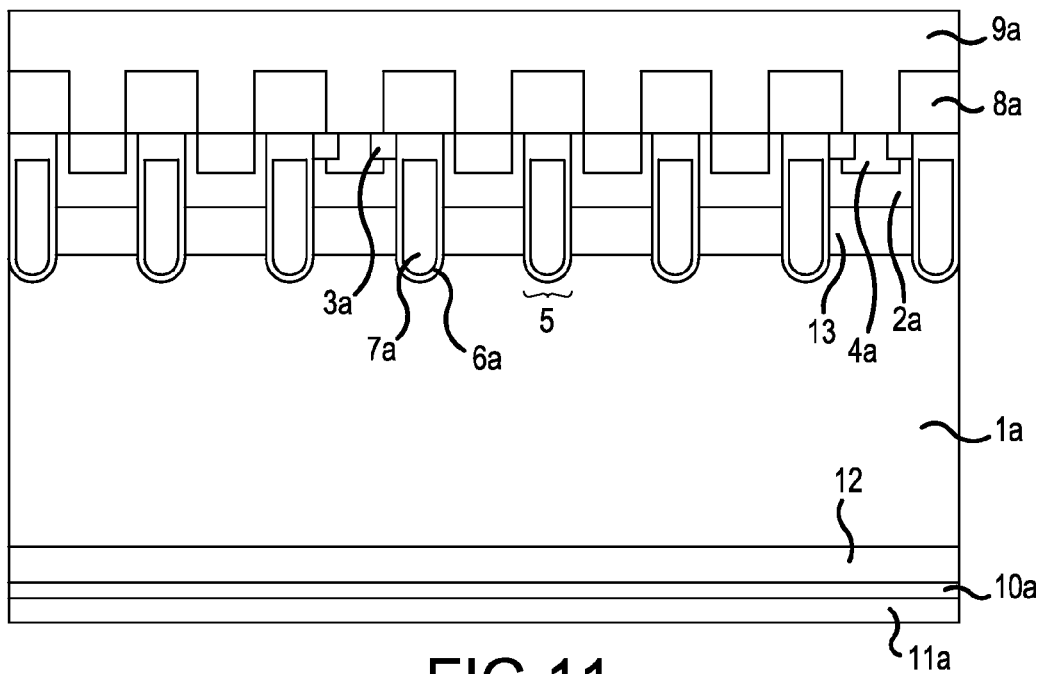
FIG. 11 is a cross-sectional view illustrating another example of the reverse blocking IGBT according to Embodiment 1.
Figure 12:
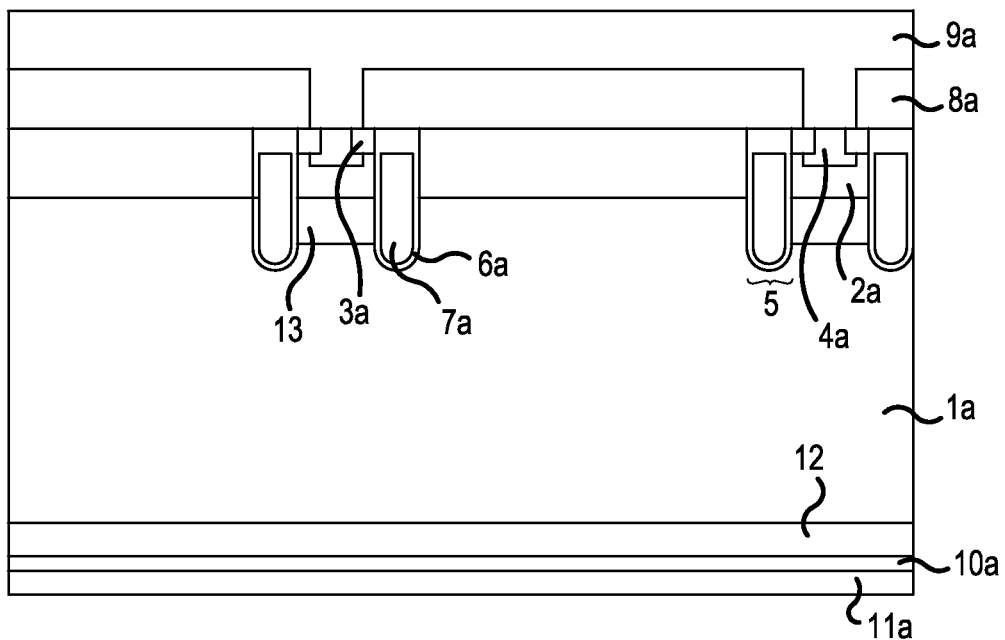
FIG. 12 is a cross-sectional view illustrating another example of the reverse blocking IGBT according to Embodiment 1.
Figure 13:
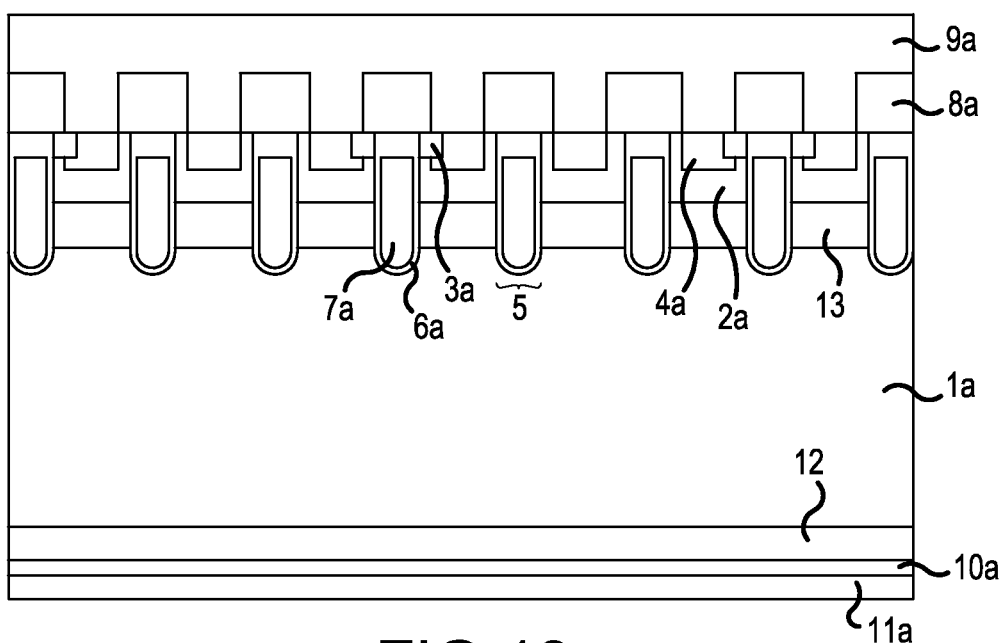
FIG. 13 is a cross-sectional view illustrating another example of the reverse blocking IGBT according to Embodiment 1.

Next, the structure of another example of the reverse blocking IGBT according to Embodiment 1 will be described. FIGS. 11 to 14 are cross-sectional views illustrating another example of the reverse blocking IGBT according to Embodiment 1. As illustrated in FIG. 11, in the reverse blocking IGBT according to Embodiment 1, a region without the n$^+$ emitter region 3a may be provided between some of the first trenches 5 and the gate electrode 7a in the first trench 5 between the regions without the n$^+$ emitter region 3a may have gate potential or emitter potential. Alternatively, as illustrated in FIG. 12, a region between some of the first trenches 5 may be covered with the interlayer insulating film 8a and have a larger width than a region between the first trenches 5 in which the n$^+$ emitter region 3a is provided. An on-current does not flow through the region covered with the interlayer insulating film 8a. Alternatively, in the reverse blocking IGBT according to Embodiment 1, as illustrated in FIG. 13, in a region between the first trenches 5 in which the n$^+$ emitter region 3a is provided, the n$^+$ emitter region 3a may be provided so as to come into contact with one of the first trenches 5. In all of the reverse blocking IGBTs illustrated in FIGS. 11, 12, and 13, hole density in the vicinity of the effective first trench 5 increases and a conductivity modulation effect is improved. As a result, the on-voltage is reduced. In addition, the reverse blocking IGBT according to Embodiment 1 may have a structure (not illustrated) in which the n LCS region 12 is omitted by adjusting the thickness of the n drift region 1a. The term "region between the effective first trenches 5" means a region between adjacent first trenches 5 in which the n$^+$ emitter region 3a is provided.

FIG. 14 illustrates the structure of an active region of the bidirectional IGBT which can control the gate in both directions, that is, the forward direction and the reverse direction. The bidirectional IGBT illustrated in FIG. 14 has the trench gate MOS structures which are provided on two main surfaces, that is, the front and rear surfaces of the semiconductor substrate and independently functions as a bidirectional switching device. The trench gate MOS structures on the front and rear surfaces of the semiconductor substrate are the same as the trench gate MOS structure of the reverse blocking IGBT illustrated in FIGS. 1, 2, and 11 to 13. The second trench on the rear surface side of the substrate is denoted by reference numeral 5*a*, the n shell region (second shell region) on the rear surface side of the substrate is denoted by reference numeral 13*a*, the p base region on the rear surface side of the substrate is denoted by reference numeral 2*b*, and an electrode on the rear surface is denoted by reference numeral 15. In the bidirectional IGBT, it is preferable that the impurity concentration of the first shell region 13 and the second shell region 13*a* which are respectively provided close to the two main surfaces be equal to the above-mentioned impurity concentration. In addition, for the impurity concentration of the n⁻ drift region 1*a*, the n⁻ drift region 1*a* may have sufficient resistivity to prevent the depletion layer, which is spread from the p base region 2*a* to the second shell region 13*a* in the n⁻ drift region 1*a* when a reverse voltage equal to the rated voltage is applied, from reaching the second shell region 13*a*. The reverse blocking IGBTs illustrated in FIGS. 11 to 13 and the bidirectional IGBT illustrated in FIG. 14 have the same effect as the reverse blocking IGBT illustrated in FIGS. 1 and 2.

Embodiment 2

Figure 18:
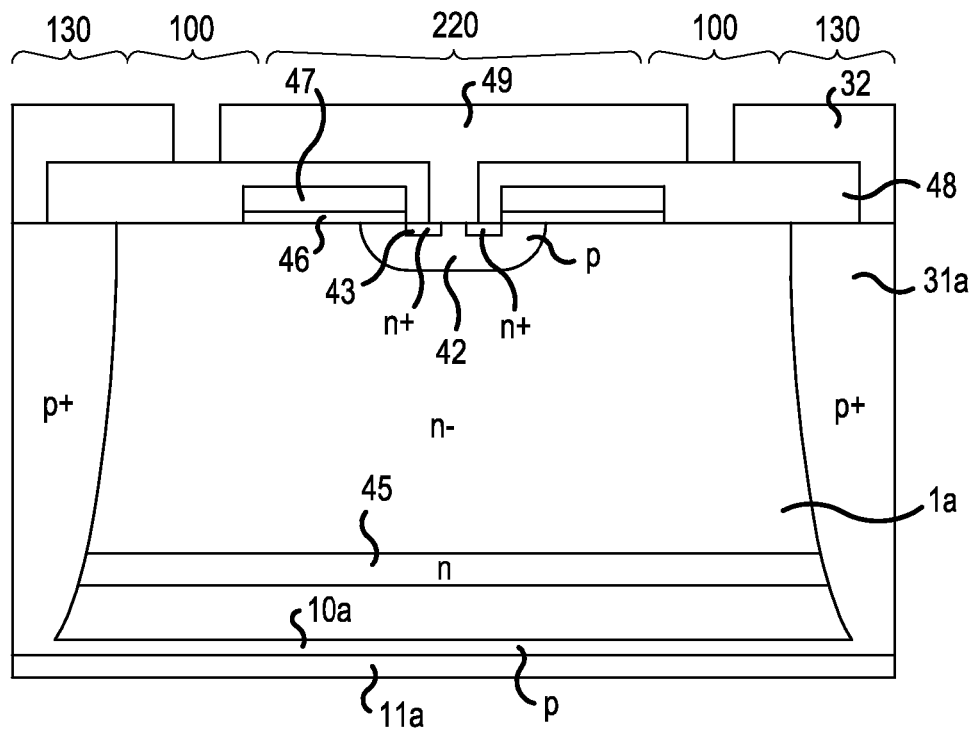
FIG. 18 is a cross-sectional view illustrating the structure of a reverse blocking IGBT according to Embodiment 2 of the invention.
Figure 19:
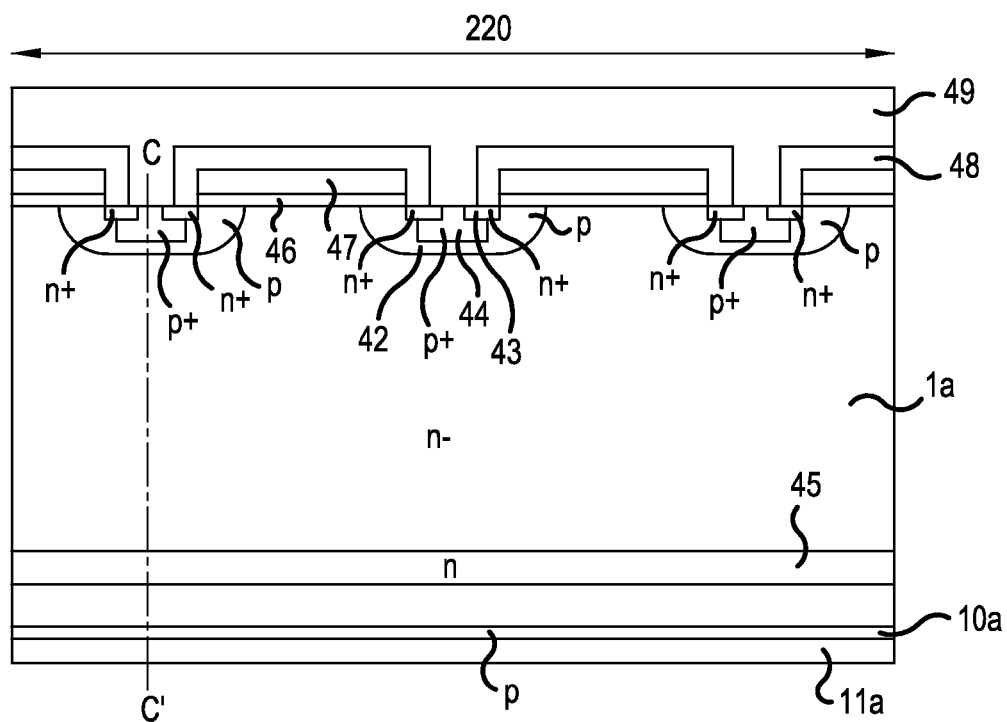
FIG. 19 is a cross-sectional view illustrating the structure of an active region of the reverse blocking IGBT illustrated in FIG. 18.
Figure 20:
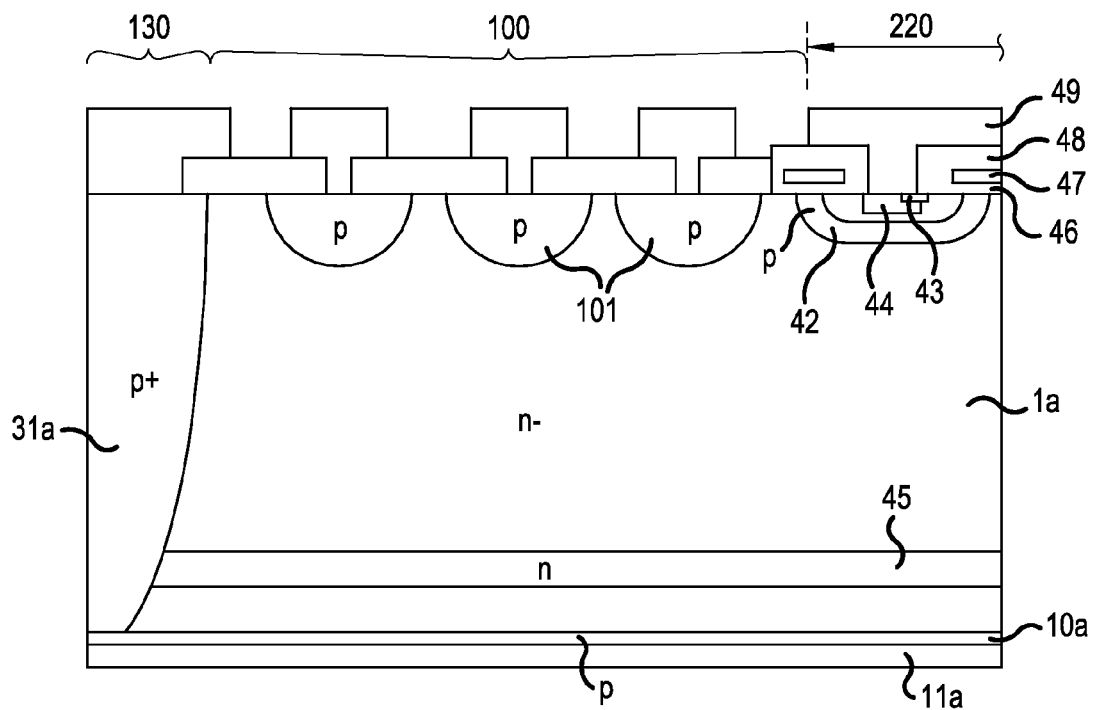
FIG. 20 is a cross-sectional view illustrating the structure of an edge termination structure region of the reverse blocking IGBT illustrated in FIG. 18.

A reverse blocking IGBT will be described as an example of a semiconductor device according to Embodiment 2 will be described. FIG. 18 is a cross-sectional view illustrating the structure of the reverse blocking IGBT according to Embodiment 2 of the invention. FIG. 19 is a cross-sectional view illustrating the structure of an active region of the reverse blocking IGBT illustrated in FIG. 18. FIG. 20 is a cross-sectional view illustrating the structure of an edge termination structure region of the reverse blocking IGBT illustrated in FIG. 18. The reverse blocking IGBT according to Embodiment 2 differs from the reverse blocking IGBT according to Embodiment 1 in that an n-type high-concentration region 45 is provided in the vicinity of the p collector region 10*a* in the n⁻ drift region 1*a*, instead of the n shell region.

As illustrated in FIGS. 18 and 19, in the reverse blocking IGBT according to Embodiment 2, an emitter electrode 49 and a planar MOS gate structure including a p base region 42, an n⁺ emitter region 43, a p body region 44, a gate insulating film 46, and a gate electrode 47 are provided on the front surface side of an FZ silicon substrate (semiconductor substrate), which will be an n⁻ drift region 1*a*, in the active region 220. Specifically, the n⁻ drift region 1*a* has sufficient resistivity to prevent a depletion layer, which is spread from a pn junction (p base junction) between the p base region 42 and the n⁻ drift region 1*a* to the p collector region 10*a* when a reverse voltage equal to a rated voltage is applied, from reaching the n-type high-concentration region 45.

The p base region 42 is selectively provided in a surface layer of the front surface of the semiconductor substrate. The n⁺ emitter region 43 and the p body region 44 are selectively provided in the p base region 42. The gate electrode 47 is provided on the surface of a portion of the p base region 42 which is interposed between the n⁺ emitter region 43 and the n⁻ drift region 1*a*, with a gate insulating film interposed therebetween. The emitter electrode 49 is electrically connected to the n⁺ emitter region 43 and the p⁺ body region 44. In addition, the emitter electrode 49 is electrically insulated from the gate electrode 47 by an interlayer insulating film 48.

Similarly to Embodiment 1, the p collector region 10*a* and a collector electrode 11*a* are provided on the rear surface side of the semiconductor substrate which will be the n⁻ drift region 1*a*. The n-type high-concentration region 45 is provided close to the p collector region 10*a* in the n⁻ drift region 1*a*. The provision of the n-type high-concentration region 45 makes it possible to suppress the injection of a minority carrier from the p collector region 10*a* to the n⁻ drift region 1*a* and to reduce transport efficiency when the depletion layer is spread from a p base junction to the p collector region 10*a* at the time the forward voltage is applied.

The n-type high-concentration region 45 is provided so as to be separated from the p collector region 10*a*. Therefore, when the depletion layer is spread from the p base junction to the p collector region 10*a* at the time the forward voltage is applied, a neutral region remains between the n-type high-concentration region 45 and the p collector region 10*a*, which makes it possible to suppress the oscillation of a voltage waveform and a current waveform at the time the semiconductor device is turned off.

The n-type high-concentration region 45 faces at least a portion of the surface of the p collector region 10*a* which is close to the p base region 42, with the n drift region 1*a* interposed therebetween. Therefore, the extension of the depletion layer which is spread from the collector junction to the p base region 42 is reduced and it is possible to adjust a reverse breakdown voltage so as to be close to a predetermined breakdown voltage (rated voltage). As a result, it is possible to reduce the length of the edge termination structure region (the width of the edge termination structure region in the direction from the active region 220 to the outer circumference of the substrate), as compared to the reverse blocking IGBT without the n-type high-concentration region according to the related art.

It is preferable that the n-type high-concentration region 45 be provided so as to face the entire surface of the p collector region 10*a* which is close to the p base region 42, with the n⁻ drift region 1*a* interposed therebetween. That is, it is preferable that the n-type high-concentration region 45 be provided so as to face the depletion layer which is spread from the p collector region 10*a* and the pn junction (collector junction) between the isolation region 31*a* and the n⁻ drift region 1*a* to the p base region 42 when the reverse voltage is applied. The reason is that, when the depletion layer is spread from the collector junction to the p base region 42 at the time the reverse voltage is applied, electric field intensity in the semiconductor substrate can be made uniform. The n-type high-concentration region 45 may come into contact with the isolation region 31*a*.

The n-type high-concentration region 45 has sufficient impurity concentration to fully deplete the n-type high-concentration region 45 when the depletion layer is spread from the collector junction to the p base region 42 at the time the reverse voltage is applied. Specifically, the total amount of impurity (total dose) $N_D x$ of the n-type high-concentration region 45 is represented by the following Expressions (1) and (2) on the basis of a one-dimensional Poisson equation.

Expression 1

$$E = \frac{qN_D x}{\varepsilon_{Si}\varepsilon_0} \quad (1)$$

-continued

Expression 2

$$N_D x = \frac{\varepsilon_{Si}\varepsilon_0 E_{crit}}{q} \quad (2)$$

In the above-mentioned expressions, E is electric field intensity, $E_{crit}$ is critical electric field intensity, q is an elementary charge, $N_D$ is donor concentration, x is the distance of the depletion layer, $\varepsilon_{Si}$ is the relative permittivity of silicon, and $\varepsilon_0$ is the permittivity of a vacuum. A predetermined physical property value is substituted into Expression (2) to obtain the limit value of the total amount of impurity $N_D x$ of the n-type high-concentration region 45. Specifically, the total amount of impurity $N_D x$ of the n-type high-concentration region 45 may be equal to or less than about $2.0 \times 10^{12}$ cm$^{-2}$. The n-type high-concentration region 45 may include n-type impurities so as to satisfy the total amount of impurity $N_D x$ and the n-type impurities may be unevenly distributed such that a large amount of n-type impurities is contained in a portion of the n-type high-concentration region 45. That is, the effect of the invention is obtained by providing the n-type high-concentration region 45 regardless of the impurity concentration distribution of the n-type high-concentration region 45. The edge termination structure region 100 and the separation portion 130 (isolation region 31a) have the same structures as those according to Embodiment 1.

Figures 21A, 21B:
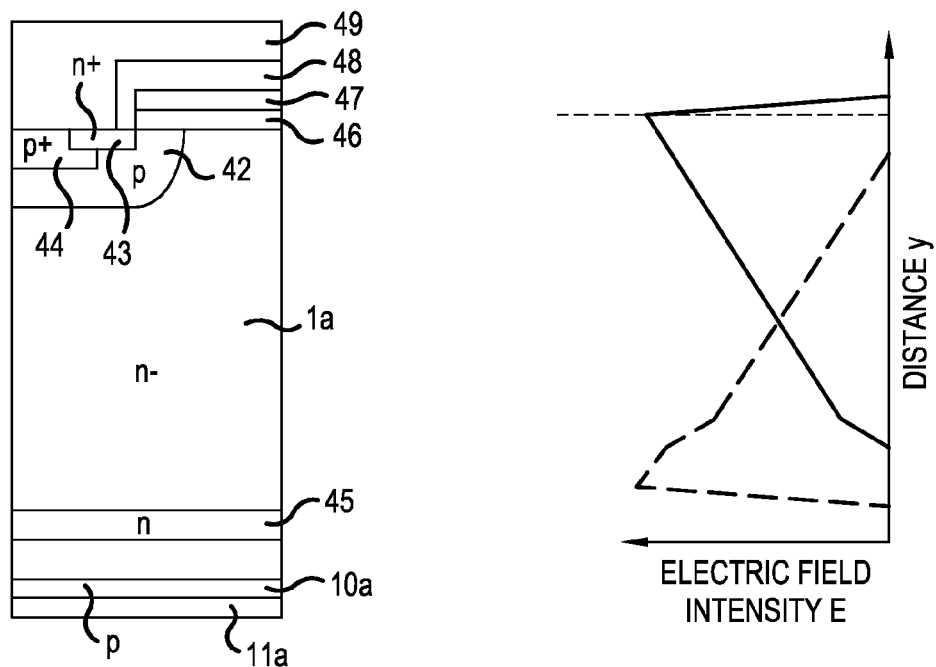
FIGS. 21A and 21B are diagrams illustrating the electric field intensity distributions of the reverse blocking IGBT according to Embodiment 2 when a forward voltage is applied and when a reverse voltage is applied.

Next, the electric field intensity distribution of the reverse blocking IGBT according to Embodiment 2 when the forward voltage is applied and when the reverse voltage will be described. FIG. 21 is a diagram illustrating the electric field intensity distributions of the reverse blocking IGBT according to Embodiment 2 when the forward voltage is applied and when the reverse voltage is applied. FIG. 21A illustrates the cross-sectional structure of a main portion of the reverse blocking IGBT according to Embodiment 2. In FIG. 21B, the horizontal axis is the depth (distance y) from the rear surface of the substrate in the reverse blocking IGBT illustrated in FIG. 21A and the vertical axis is the distribution of electric field intensity E when the forward voltage is applied (solid line) and when the reverse voltage is applied (dashed line).

The n-type high-concentration region 45 is provided under the above-mentioned conditions to obtain the electric field intensity distribution illustrated in FIG. 21B. Specifically, as represented by the solid line in FIG. 21B, the depletion layer which is spread from the p base junction to the p collector region 10a when the forward voltage is applied can be stopped in the vicinity of the n-type high-concentration region 45. Therefore, it is possible to prevent the influence of the electric field on the p collector region 10a. The depletion layer which is spread from the p base junction to the p collector region 10a when the forward voltage is applied may not reach the p collector region 10a or the depletion layer may be stopped at the n$^-$ drift region 1a between the n-type high-concentration region 45 and the p collector region 10a. In this case, the same effect as described above is obtained. In contrast, as represented by the dashed line in FIG. 21B, the extension of the depletion layer which is spread from the collector junction to the p base region 42 when the reverse voltage is applied can be less than that in the reverse blocking IGBT according to the related art.

Figure 22:
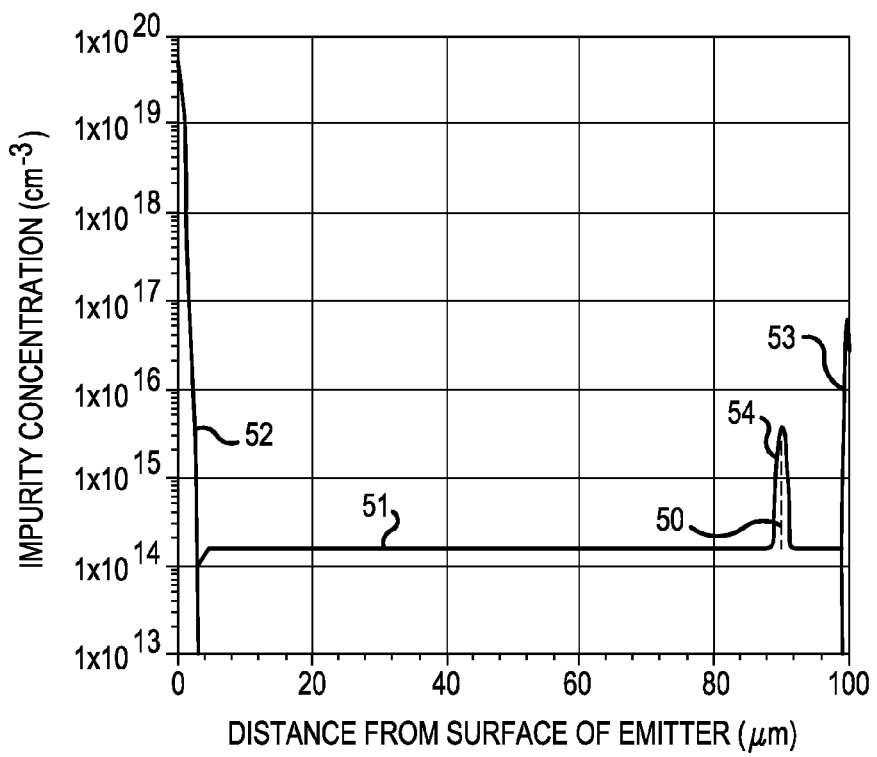
FIG. 22 is a characteristic diagram illustrating an impurity concentration distribution along the cutting line C-C' of FIG. 19.

Next, a method of calculating the effective total amount of impurity of the n-type high-concentration region 45 will be described. FIG. 22 is a characteristic diagram illustrating an impurity concentration distribution along the cutting line C-C' of FIG. 19. A reverse blocking IGBT was produced (manufactured) according to Embodiment 2. The rated voltage was 600 V and the resistivity and thickness of the semiconductor substrate were 28 Ωcm and 100 μm, respectively. That is, the resistivity of the n$^-$ drift region 1a is 28 Ωcm. First, in the reverse blocking IGBT, as illustrated in first to fourth measurement results 51 to 54 of FIG. 22, the amount of impurity of each region in the semiconductor substrate was measured.

The first measurement result 51 is the impurity concentration distribution of the n$^-$ drift region 1a. The second measurement result 52 is the impurity concentration distribution of the p base region 42. The third measurement result 53 is the impurity concentration distribution of the p collector region 10a. The fourth measurement result 54 is the impurity concentration distribution of the n-type high-concentration region 45. That is, FIG. 22 illustrates the amount of conductive impurity in each region of the semiconductor substrate in the depth direction. The fourth measurement result 54 indicating the impurity concentration distribution of the n-type high-concentration region 45 indicates the impurity concentration distribution in which impurity concentration has a peak at a predetermined depth and is reduced toward two main surfaces of the substrate, that is, the front surface and the rear surface.

The amount of impurity at each depth in the fourth measurement result 54 was integrated to calculate the total amount of impurity of the n-type high-concentration region 45. According to this method of calculating the total amount of impurity of the n-type high-concentration region 45, it is possible to calculate the total amount of impurity of the n-type high-concentration region 45 even though the impurity concentration distribution of the n-type high-concentration region 45 is not uniform. Then, a value obtained by subtracting the amount of impurity of a portion of the n$^-$ drift region 1a in which the n-type high-concentration region 45 is provided from the total amount of impurity of the n-type high-concentration region 45 is the effective total amount of impurity of the n-type high-concentration region 45.

That is, a hatched portion which is denoted by reference numeral 50 is the effective total amount of impurity of the n-type high-concentration region 45. The amount of impurity of the portion of the n$^-$ drift region 1a in which the n-type high-concentration region 45 is provided means the total amount of impurity of the n$^-$ drift region 1a in the portion of the n$^-$ drift region 1a in which the n-type high-concentration region 45 is provided. The total amount of impurity of the n$^-$ drift region 1a is calculated by integrating the amount of impurity in the depth direction, similarly to the calculation of the total amount of impurity of the n-type high-concentration region 45.

Figure 23:
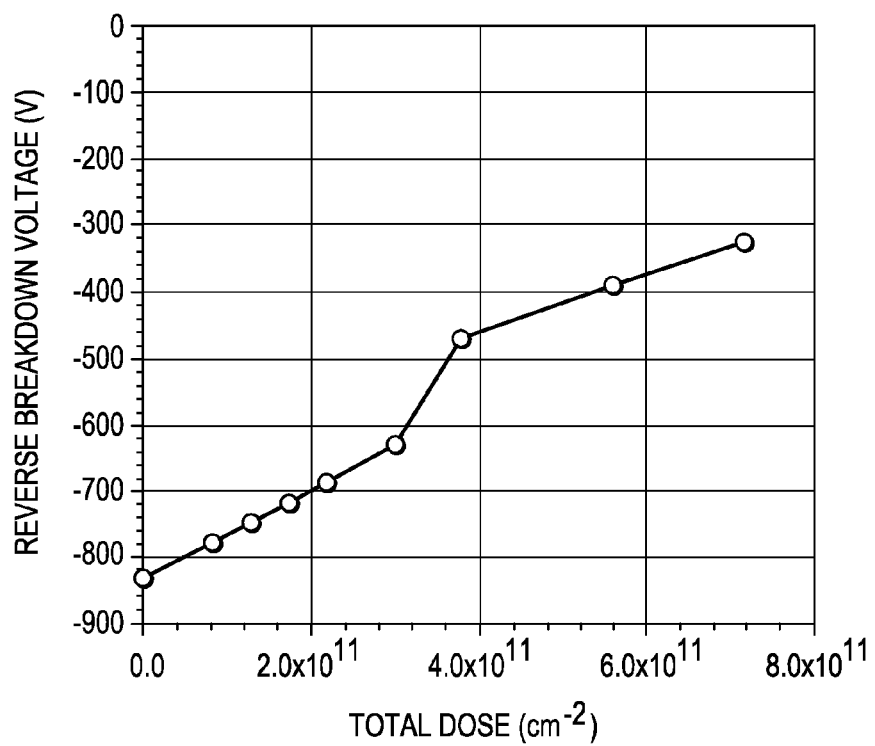
FIG. 23 is a characteristic diagram illustrating the relationship between a reverse breakdown voltage and the effective total amount of impurity in an n-type high-concentration region of the reverse blocking IGBT according to Embodiment 2.

Next, the relationship between the reverse direction breakdown voltage and the effective total amount of impurity of the n-type high-concentration region 45 was verified. FIG. 23 is a characteristic diagram illustrating the relationship between the reverse direction breakdown voltage and the effective total amount of impurity of the n-type high-concentration region in the reverse blocking IGBT according to Embodiment 2. A plurality of reverse blocking IGBTs (hereinafter, referred to as second examples) in which the n-type high-concentration regions 45 had different effective total amounts of impurity were manufactured. In each of the second examples, the effective total amount of impurity of the n-type high-concentration region 45 was in the range of $1.0 \times 10^{11}$ cm$^{-2}$ to $8.0 \times 10^{11}$ cm$^{-2}$ (which holds for FIG. 24). The n-type high-concentration region 45 was arranged at a position that was 10 μm away from the p collector region 10a. For comparison, the reverse blocking IGBT without the n-type high-concentration region 45 according to the related art (the above-mentioned comparative example) was prepared.

In the second examples and the above-mentioned comparative example, the reverse breakdown voltage was measured, with a collector-emitter voltage being 600 V (the emitter potential with respect to the collector potential is negative) and the gate being short-circuited to the emitter. The measurement result is illustrated in FIG. 23. In FIG. 23, a case in which the effective total amount of impurity of the n-type high-concentration region 45 is zero is illustrated as the comparative example. The result illustrated in FIG. 23 proved that, when the n-type high-concentration region 45 was provided, it was possible to reduce the reverse breakdown voltage. In addition, it was verified that, as the effective total amount of impurity of the n-type high-concentration region 45 increased, the reverse breakdown voltage could be reduced. Therefore, it was verified that, when the effective total amount of impurity of the n-type high-concentration region 45 was appropriately set, it was possible to adjust the reverse breakdown voltage so as to be close to a predetermined breakdown voltage (rated voltage).

Figure 24:
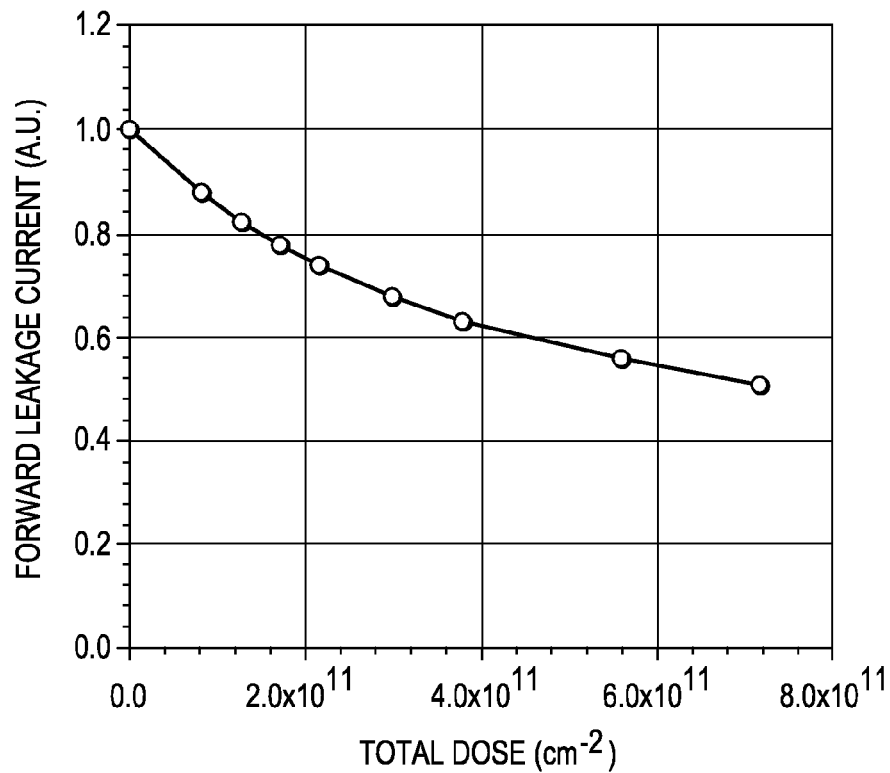
FIG. 24 is a characteristic diagram illustrating the relationship between a forward leakage current and the effective total amount of impurity in the n-type high-concentration region of the reverse blocking IGBT according to Embodiment 2.

Next, the relationship between the effective total amount of impurity of the n-type high-concentration region 45 and a forward leakage current was verified. FIG. 24 is a characteristic diagram illustrating the relationship between the effective total amount of impurity of the n-type high-concentration region and the forward leakage current in the reverse blocking IGBT according to Embodiment 2. In the second examples and the comparative example, the forward leakage current was measured, with the collector-emitter voltage being 600 V and the gate being short-circuited to the emitter. The measurement result is illustrated in FIG. 24. In FIG. 24, a case in which the effective total amount of impurity of the n-type high-concentration region 45 is zero is illustrated as the comparative example. The result illustrated in FIG. 24 proved that, when the n-type high-concentration region 45 was provided, it was possible to reduce the forward leakage current. In addition, it was verified that, as the effective total amount of impurity of the n-type high-concentration region 45 increased, the forward leakage current could be reduced. As can be seen from FIGS. 23 and 24, when the effective total amount of impurity of the n-type high-concentration region 45 was about $3.0 \times 10^{11}$ cm$^{-2}$, the forward leakage current could be set to about 0.7 (A.U) at a reverse breakdown voltage higher than about 600 V. Therefore, when the effective total amount of impurity of the n-type high concentration region 45 is equal to or greater than zero and equal to or less than $3.0 \times 10^{11}$ cm$^{-2}$, it is possible to increase the reverse breakdown voltage to the rated voltage or more, to reduce the breakdown voltage, and to reduce the forward leakage current.

Figure 25:
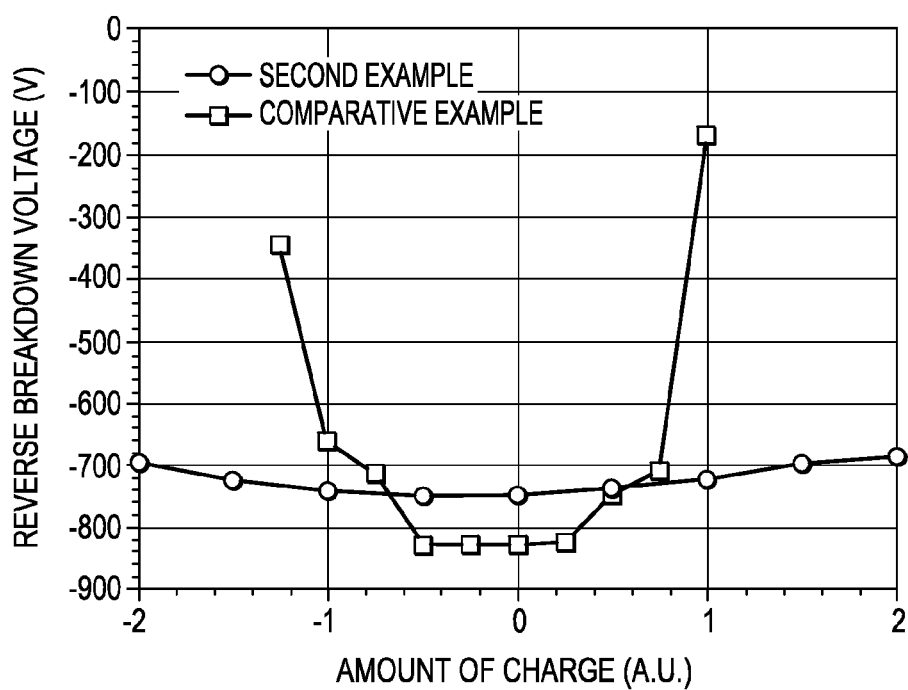
FIG. 25 is a characteristic diagram illustrating the charge resistance of the reverse blocking IGBT according to Embodiment 2.

Next, the charge resistance of the reverse blocking IGBT according to Embodiment 2 was verified. FIG. 25 is a characteristic diagram illustrating the charge resistance of the reverse blocking IGBT according to Embodiment 2. In FIG. 25, the horizontal axis indicates the amount of charge stored in the interlayer insulating film 48 which selectively covers the front surface of the substrate in the edge termination structure region 100 and the vertical axis indicates a reverse breakdown voltage when a reverse voltage is applied. In the second examples (the effective total amount of impurity of the n-type high-concentration region 45 was $1.0 \times 10^{11}$ cm$^{-2}$) and the comparative example, the reverse breakdown voltage was measured by a device simulation while changing the amount of charge in the interlayer insulating film 48. The calculation result is illustrated in FIG. 25. The length of the edge termination structure region 100 in the second example was substantially equal to the length of the edge termination structure region in the comparative example.

The result illustrated in FIG. 25 provided that, in the comparative example, a sufficiently high breakdown voltage was obtained when the amount of charge was about zero and the breakdown voltage was rapidly reduced when the amount of positive charge or negative charge stored in the interlayer insulating film of the edge termination structure region was greater than a predetermined value. In contrast, the result proved that, in the second examples, even when the positive charge or negative charge was stored in the interlayer insulating film 48 of the edge termination structure region 100, it was possible to maintain the breakdown voltage that was substantially equal to that when the amount of charge was zero. Therefore, in the second examples, when the edge termination structure regions have substantially the same length, flexibility in the design is higher than that in the comparative example. The reverse blocking IGBT may have a charge resistance that is equal to or greater than a predetermined value, in order to ensure the long-term reliability of the edge termination structure region. Therefore, in the second examples, the structure of the edge termination structure region 100 is simplified and the length of the edge termination structure region 100 can be less than that in the comparative example.

As described above, according to Embodiment 2, even when the n-type high-concentration region is provided in the vicinity of the p collector region in the n drift region, instead of the n shell region, it is possible to obtain the same effect as that in Embodiment 1. In addition, according to Embodiment 2, since the n-type high-concentration region is provided in the vicinity of the p collector region in the n⁻ drift region, it is possible to adjust the reverse breakdown voltage so as to be close to the rated voltage. Therefore, it is possible to reduce the length of the edge termination structure region. According to Embodiment 2, the provision of the n-type high-concentration region makes it possible to improve the charge resistance while reducing the length of the edge termination structure region.

According to Embodiment 2, the provision of the n-type high-concentration region makes it possible to reduce the amount of forward leakage current. Furthermore, according to Embodiment 2, since the n-type high-concentration region is provided in the vicinity of the p collector region in the n⁻ drift region, it is possible to form a non-punch-through reverse blocking IGBT. Therefore, when the reverse blocking IGBT is turned off, the voltage waveform and the current waveform do not oscillate. In addition, according to Embodiment 2, it is not necessary to provide a trench in the rear surface of the substrate. Therefore, it is possible to simplify a manufacturing process and to manufacture a reverse blocking IGBT at a low cost.

The invention is not limited to the above-described embodiments, but various modifications and changes of the invention can be made without departing from the scope and spirit of the invention. For example, in each of the above-described embodiments, for example, the dimensions or surface concentration of each portion may be changed depending on required specifications. In addition, in Embodiment 2, a trench gate MOS structure may be provided instead of the planar gate MOS structure. Furthermore, in each embodiment, the n type and the p type may be reversed.

As described above, the semiconductor device according to the invention is useful for a power semiconductor device that is used as a switching device of a power conversion circuit, such as a matrix converter.

Thus, a semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

EXPLANATION OF LETTERS OR NUMERALS 1, 1a n⁻ drift region
2, 2a p base region
2b p base region on rear surface side of substrate
3, 3a n⁺ emitter region
4, 4a p⁺ body region
5 first trench
5a second trench
6, 6a gate insulating film
7, 7a gate electrode
8, 8a insulating film, interlayer insulating film
8b field insulating film
9, 9a emitter electrode
10, 10a p collector region
11, 11a collector electrode
12 n LCS region
13 n shell region (first shell region)
13a n shell region (second shell region)
14 field plate
15 electrode on rear surface side
20 p base junction
21 collector junction
21a ISOLATION region junction
31a ISOLATION region
100 edge termination structure region
101 field limiting ring
200 active region

What is claimed is:

1. A semiconductor device comprising:
a drift region that is a semiconductor substrate of a first conductivity type;
a base region of a second conductivity type that is selectively provided in a surface layer of a first main surface of the semiconductor substrate;
an emitter region of the first conductivity type that is selectively provided in the base region;
a trench that extends from the first main surface of the semiconductor substrate to the drift region through the emitter region and the base region;
an insulating film that is provided along an inner wall of the trench;
a gate electrode that is embedded in the trench through the insulating film;
an emitter electrode that comes into contact with the emitter region and the base region;
a shell region of the first conductivity type that is provided in the drift region so as to come into contact with a surface of the base region close to the drift region; and
a collector region of the second conductivity type that is provided in a surface layer of a second main surface of the semiconductor substrate, wherein:
the shell region has a higher impurity concentration than the drift region,
an effective dose of a first-conductivity-type impurity in the shell region is equal to or less than $5.0 \times 10^{12}$ cm$^{-2}$, and
the drift region has a resistivity to prevent a depletion layer, which is spread from the collector region when a reverse rated voltage with the emitter electrode as a positive electrode is applied, from reaching either the shell region or the bottom of the trench, whichever is closer to the collector region than the other.

2. The semiconductor device according to claim 1, wherein the effective dose of the first-conductivity-type impurity in the shell region is equal to or less than $4.0 \times 10^{12}$ cm$^{-2}$.

3. The semiconductor device according to claim 1, wherein a first-conductivity-type region that has a higher impurity concentration than the drift region is provided between the drift region and the collector region to reduce a leakage current.

4. The semiconductor device according to claim 1, further comprising an isolation region of the second conductivity type that is provided in an outer circumferential end portion of the drift region and extends from the first main surface of the semiconductor substrate to the collector region.

5. The semiconductor device according to claim 1, wherein the drift region has a resistivity to prevent the depletion layer, which is spread from the collector region to the base region when the reverse rated voltage is applied with the emitter electrode as the positive electrode, from reaching either the base region or the bottom of the trench, whichever is closer to the collector region than the other.

6. A semiconductor device comprising:
a drift region that is a semiconductor substrate of a first conductivity type;
a first base region of a second conductivity type that is selectively provided in a surface layer of a first main surface of the semiconductor substrate;
a first emitter region of the first conductivity type that is selectively provided in the first base region;
a first trench that extends from the first main surface of the semiconductor substrate to the drift region through the first emitter region and the first base region;
a first insulating film that is provided along an inner wall of the first trench;
a first gate electrode that is embedded in the first trench through the first insulating film;
an emitter electrode that comes into contact with the first emitter region and the first base region;
a first shell region of the first conductivity type that is provided in the drift region so as to come into contact with a surface of the first base region close to the drift region;
a second base region of the second conductivity type that is selectively provided in a surface layer of a second main surface of the semiconductor substrate;
a second emitter region of the first conductivity type that is selectively provided in the second base region;
a second trench that extends from the second main surface of the semiconductor substrate to the drift region through the second emitter region and the second base region;
a second insulating film that is provided along an inner wall of the second trench;
a second gate electrode that is embedded in the second trench through the second insulating film;
a rear surface electrode that comes into contact with the second emitter region and the second base region; and
a second shell region of the first conductivity type that is provided in the drift region so as to come into contact with a surface of the second base region close to the drift region, wherein:
the first shell region and the second shell region have a higher impurity concentration than the drift region, an effective dose of a first-conductivity-type impurity in the first shell region and the second shell region is equal to or less than $5.0 \times 10^{12}$ cm$^{-2}$, and the drift region has a resistivity to prevent a depletion layer, which is spread from the second base region when a reverse rated voltage is applied with the emitter electrode as a positive electrode, from reaching either the first shell region or the bottom of the first trench, whichever is closer to the second shell region than the other.

7. The semiconductor device according to claim 6, wherein the effective dose of the first-conductivity-type impurity in the second shell region is equal to or less than $4.0 \times 10^{12}$ cm$^{-2}$.

8. The semiconductor device according to claim 6, wherein the drift region has a resistivity to prevent the depletion layer, which is spread from the second base region to the first base region when the reverse rated voltage is applied with the emitter electrode as the positive electrode, from reaching either the first base region or the bottom of the first trench, whichever is closer to the second shell region than the other.

\* \* \* \* \*